(12) United States Patent
Takagi et al.

(10) Patent No.: US 11,462,401 B2
(45) Date of Patent: Oct. 4, 2022

(54) SUBSTRATE PROCESSING APPARATUS, METHOD OF MANUFACTURING SEMICONDUCTOR DEVICE, AND NON-TRANSITORY COMPUTER-READABLE RECORDING MEDIUM

(71) Applicant: Hitachi Kokusai Electric Inc., Tokyo (JP)

(72) Inventors: Kosuke Takagi, Toyama (JP); Naonori Akae, Toyama (JP); Masato Terasaki, Toyama (JP); Mikio Ohno, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/293,469

(22) Filed: Jun. 2, 2014

(65) Prior Publication Data

US 2014/0357058 A1 Dec. 4, 2014

(30) Foreign Application Priority Data

Jun. 3, 2013 (JP) .............................. JP2013-117280

(51) Int. Cl.
*H01L 21/02* (2006.01)
*H01L 21/67* (2006.01)
(Continued)

(52) U.S. Cl.
CPC ........ *H01L 21/0262* (2013.01); *C23C 16/308* (2013.01); *C23C 16/402* (2013.01);
(Continued)

(58) Field of Classification Search
CPC ... C23C 16/308; C23C 16/402; C23C 16/403; C23C 16/405; C23C 16/45523;
(Continued)

(56) References Cited

U.S. PATENT DOCUMENTS 6,435,865 B1 * 8/2002 Tseng ................ C23C 16/45578
118/715
7,422,635 B2 * 9/2008 Zheng ............... C23C 16/45546
118/715
(Continued)

FOREIGN PATENT DOCUMENTS

JP 2006-054432 A 2/2006
JP 2006-190787 A 7/2006
(Continued)

OTHER PUBLICATIONS

Korean Notice of Reasons of Rejection, KR Application No. 10-2014-0065660, dated Sep. 25, 2015, 15 pages (English translation provided).

*Primary Examiner* — Benjamin Kendall
(74) *Attorney, Agent, or Firm* — Volpe Koenig

(57) ABSTRACT

There is provided a substrate processing apparatus including: a process chamber configured to accommodate and process a plurality of substrates arranged with intervals therebetween; a first nozzle extending along a stacking direction of the substrates and configured to supply a hydrogen-containing gas into the process chamber; and a second nozzle extending along the stacking direction of the substrates and configured to supply an oxygen-containing gas into the process chamber, wherein the first nozzle includes a plurality of first gas supply holes disposed in a region extending from an upper portion to a lower portion of the first nozzle corresponding to a substrate arrangement region where the substrates are arranged, and the second nozzle includes a plurality of second gas supply holes disposed at an upper portion and a lower portion of the second nozzle to correspond to upper substrates and lower substrates of the substrates.

21 Claims, 23 Drawing Sheets

(51) Int. Cl.
*C23C 16/40* (2006.01)
*C23C 16/455* (2006.01)
*C23C 16/30* (2006.01)
*H01J 37/32* (2006.01)

(52) U.S. Cl.
CPC .......... *C23C 16/403* (2013.01); *C23C 16/405* (2013.01); *C23C 16/45523* (2013.01); *C23C 16/45534* (2013.01); *H01J 37/32449* (2013.01); *H01L 21/67109* (2013.01); *H01L 21/02532* (2013.01)

(58) Field of Classification Search
CPC ........ C23C 16/45534; C23C 16/45574; C23C 16/45578; C23C 16/481; C23C 16/482; C23C 16/52; H01L 21/02532; H01L 21/0262; H01L 21/67109; H01L 21/67115; H01L 21/67303–67309; H01J 37/32–3299
See application file for complete search history.

(56) References Cited

U.S. PATENT DOCUMENTS

| | | | |
|---|---|---|---|
| 7,807,587 B2 * | 10/2010 | Matsuura | C23C 16/45591 438/800 |
| 8,367,557 B2 | 2/2013 | Akae et al. | |
| 2001/0052556 A1 * | 12/2001 | Ting | C21B 7/16 239/556 |
| 2003/0186517 A1 * | 10/2003 | Takagi | C23C 16/452 438/478 |
| 2003/0186560 A1 * | 10/2003 | Hasebe | C23C 16/455 438/778 |
| 2006/0032442 A1 | 2/2006 | Hasebe | |
| 2010/0105192 A1 * | 4/2010 | Akae | C23C 16/45525 438/478 |
| 2010/0218724 A1 * | 9/2010 | Okada | C23C 16/4405 118/724 |
| 2011/0294280 A1 * | 12/2011 | Takasawa | C23C 16/30 438/478 |
| 2012/0199067 A1 * | 8/2012 | Morozumi | H01L 21/67109 118/719 |
| 2015/0059978 A1 * | 3/2015 | Park | C23C 16/04 156/345.24 |

FOREIGN PATENT DOCUMENTS

| | | |
|---|---|---|
| JP | 2010-153776 A | 7/2010 |
| JP | 2011-035189 A | 2/2011 |
| KR | 10-2008-0027199 A | 3/2008 |
| KR | 10-2011-0056233 A | 5/2011 |

\* cited by examiner

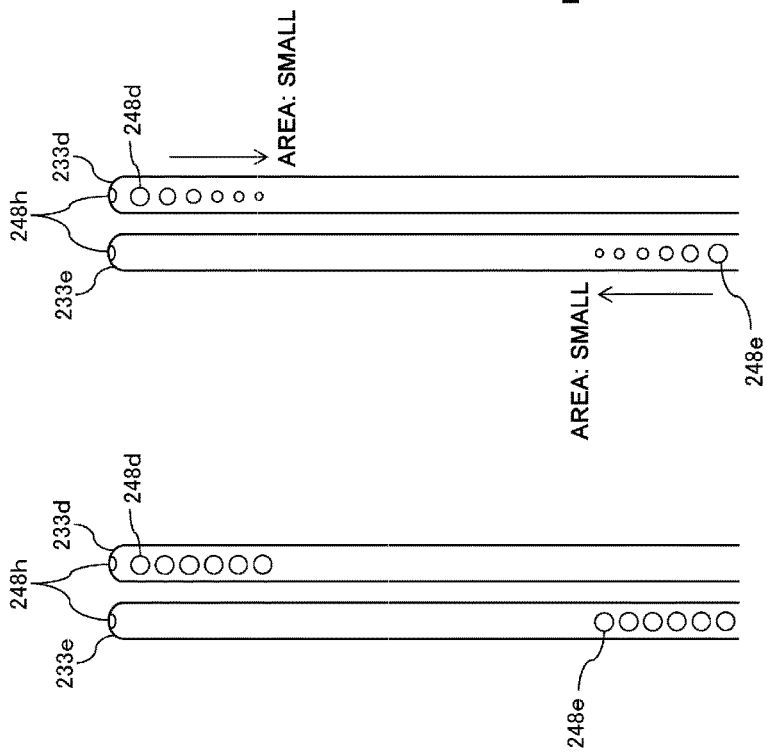

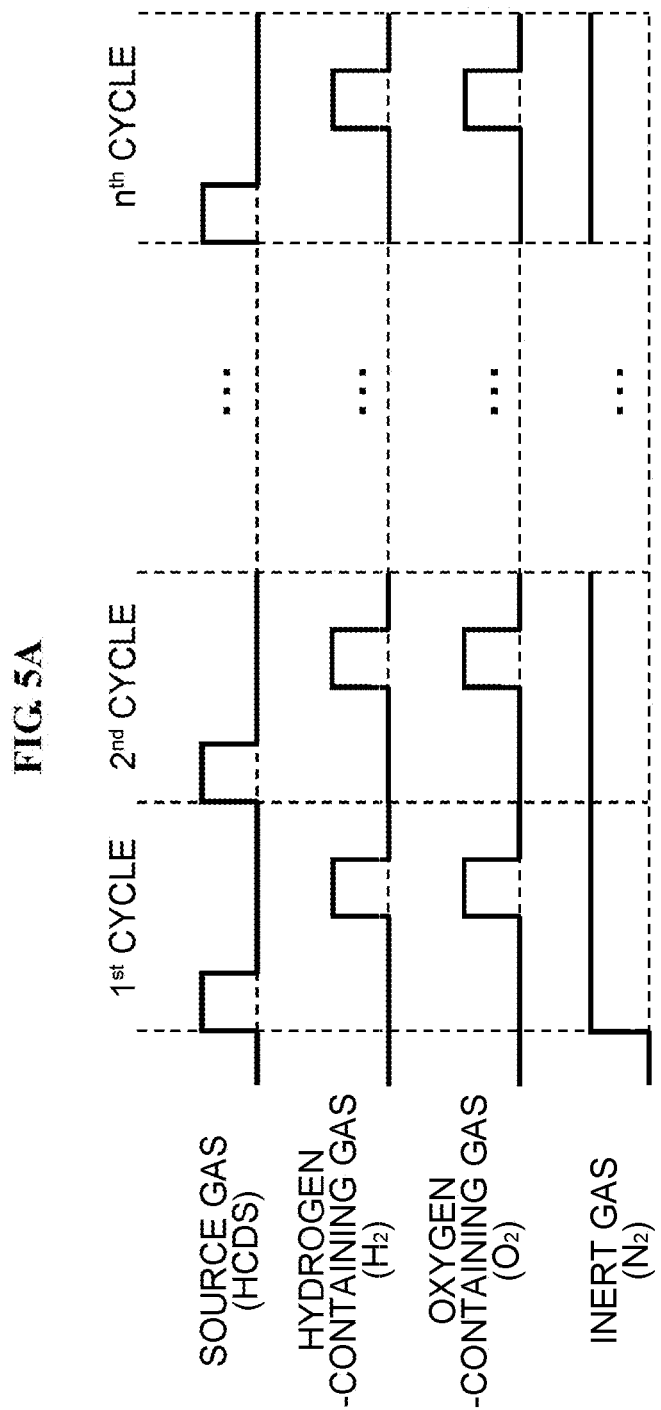

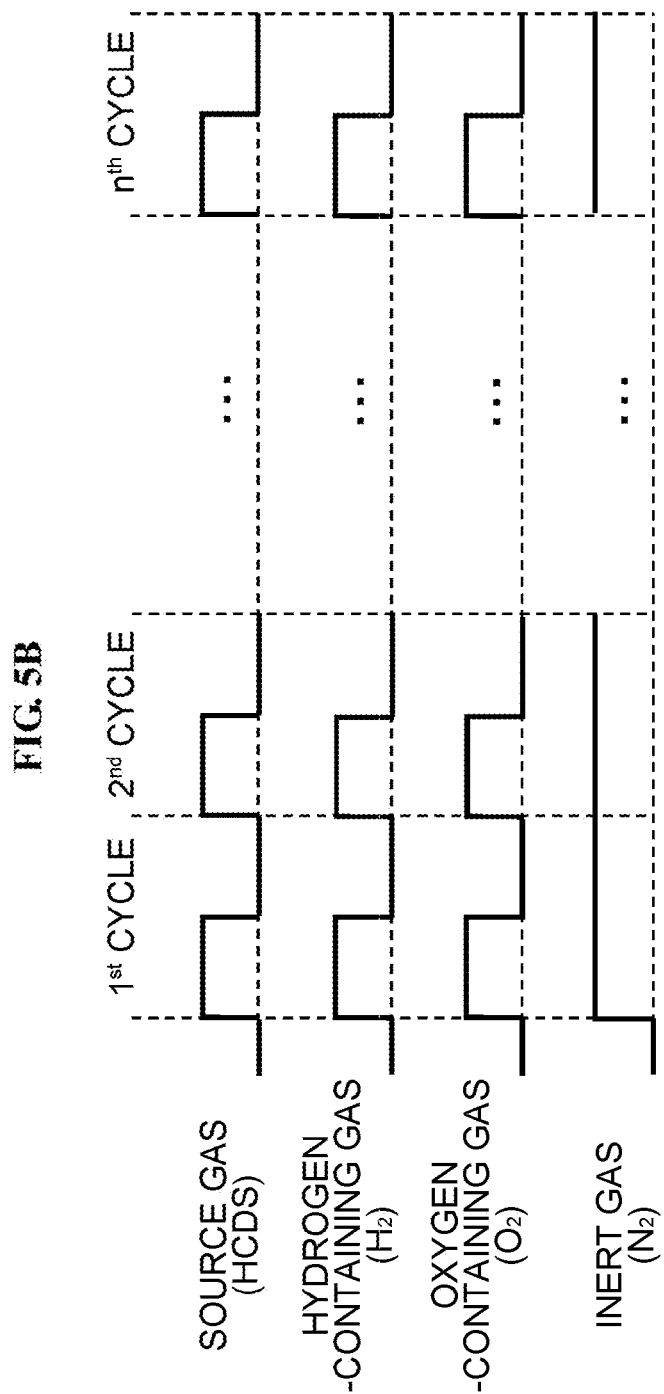

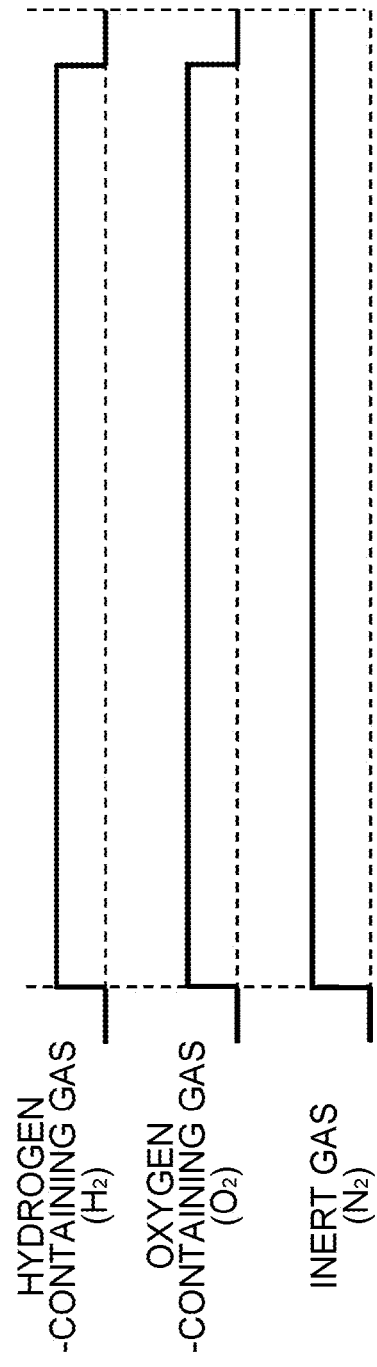

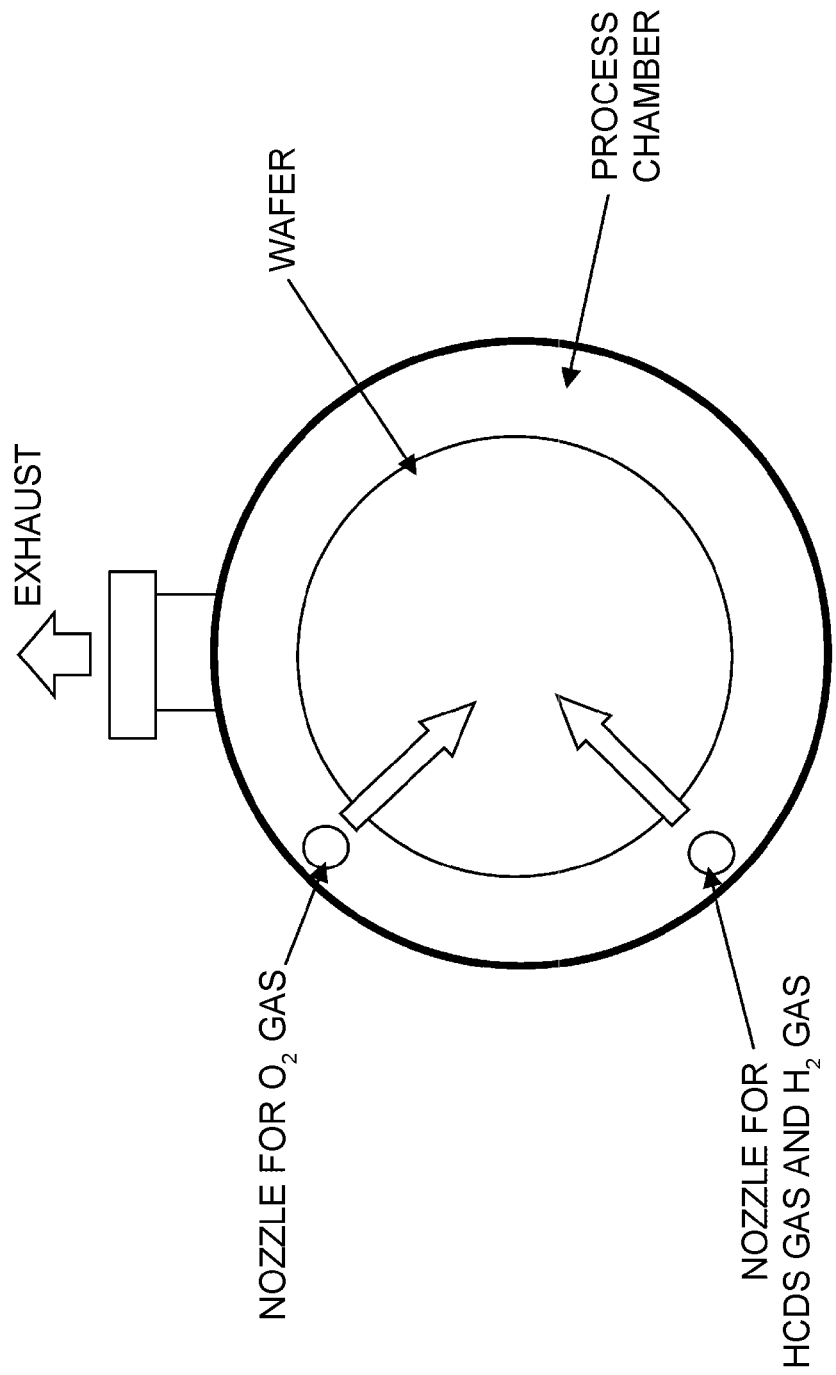

PRIOR ART

PRIOR ART

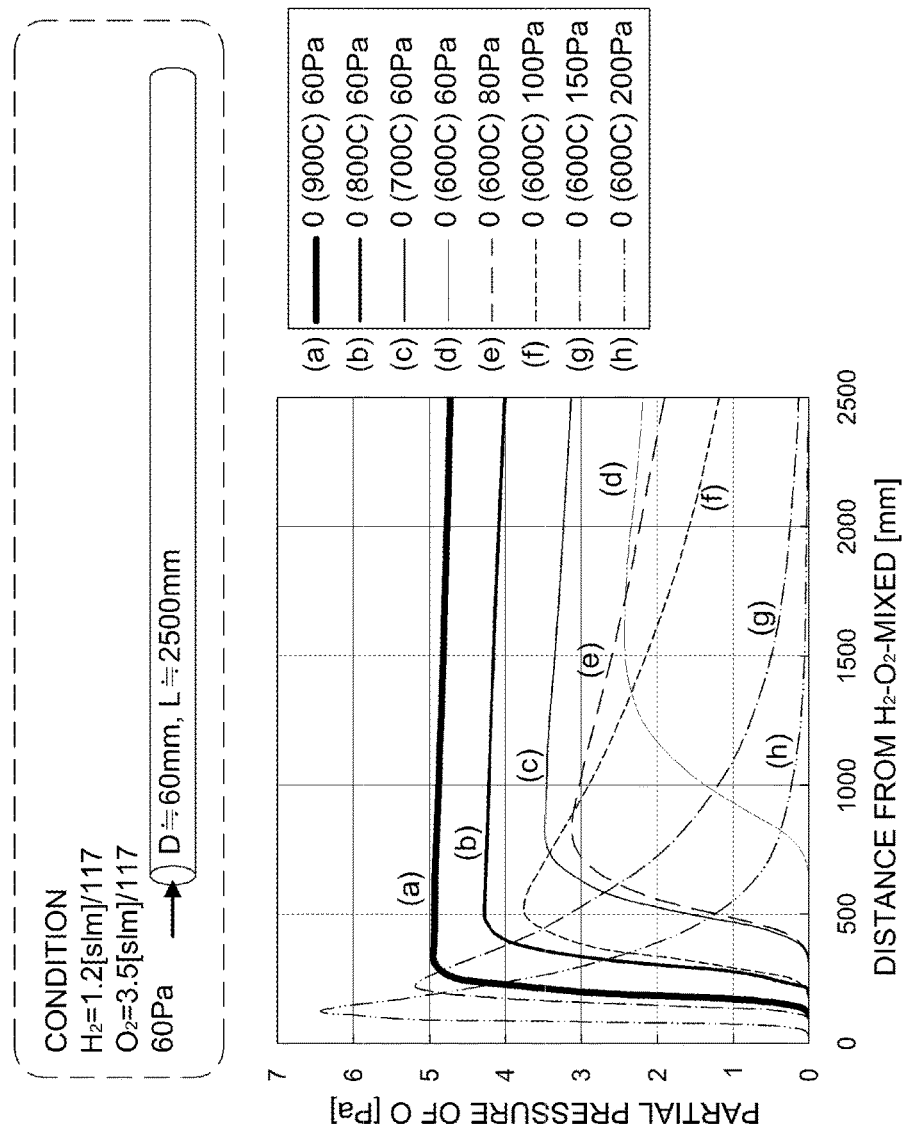

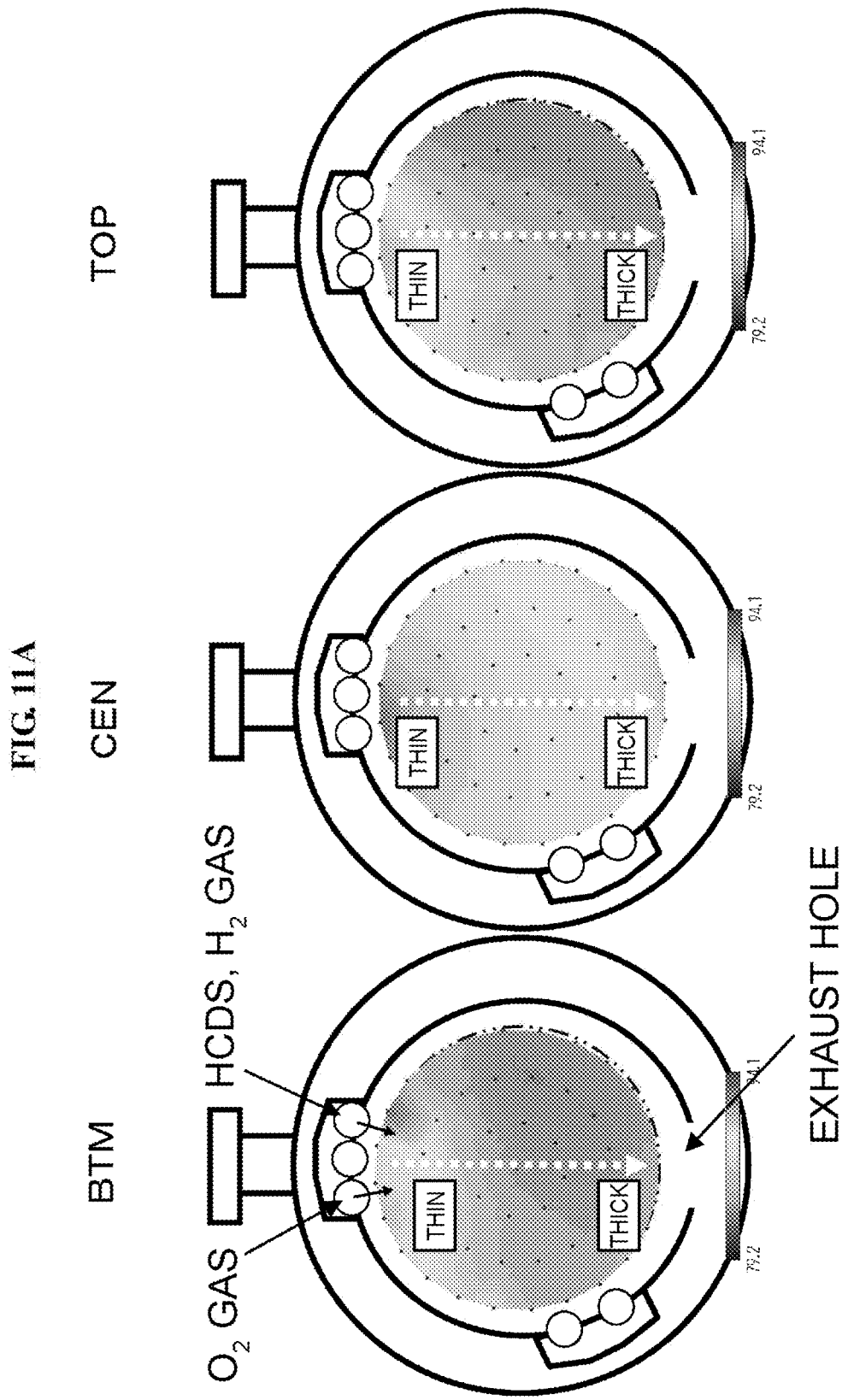

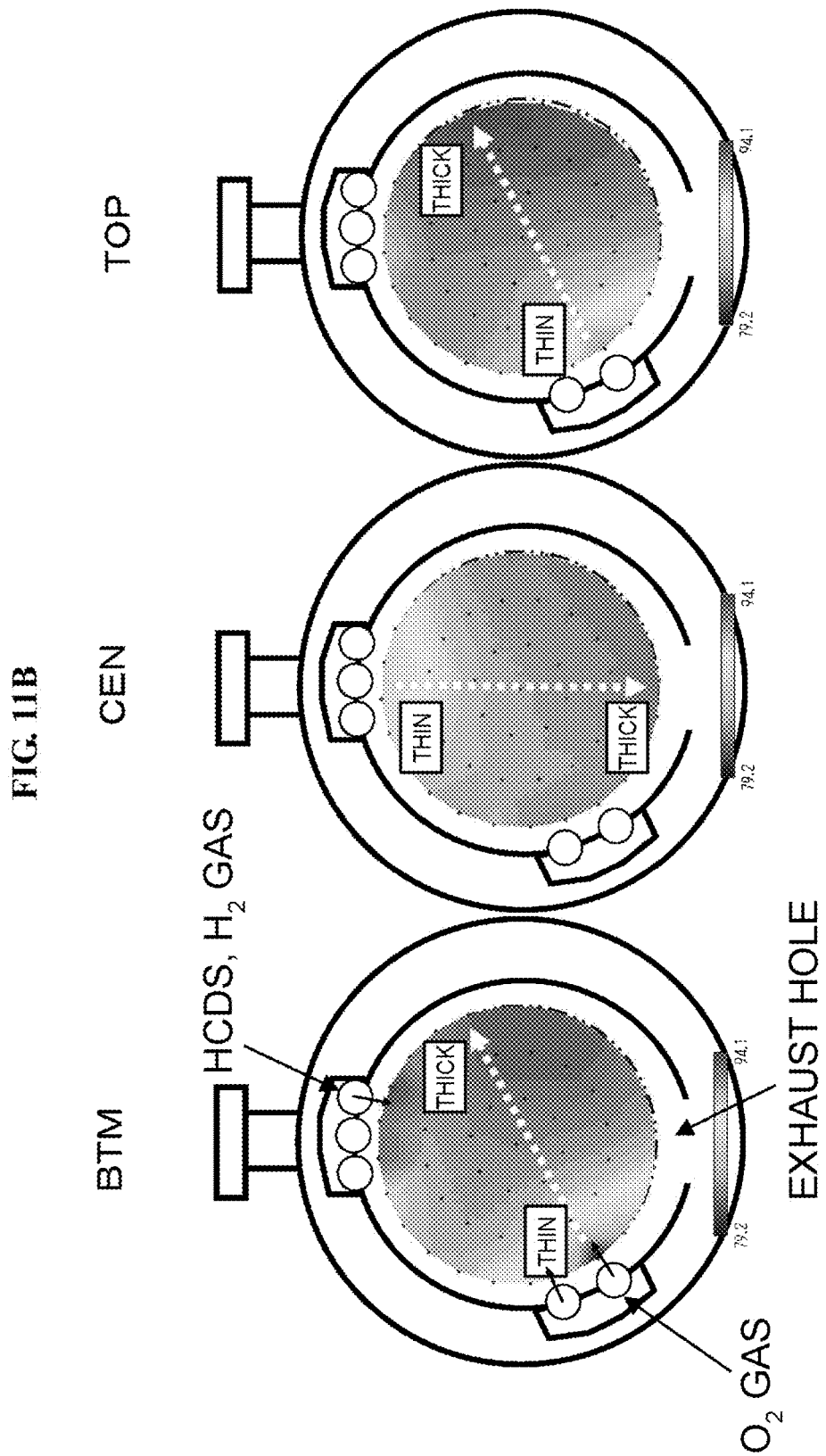

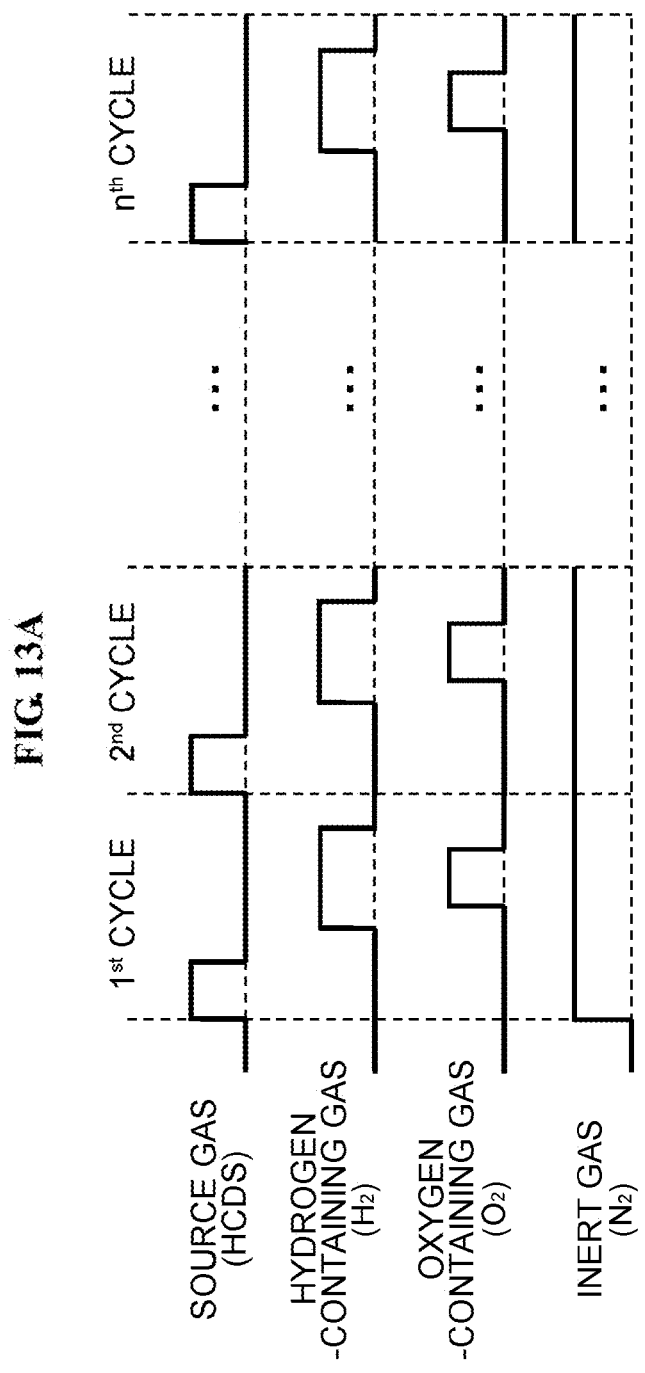

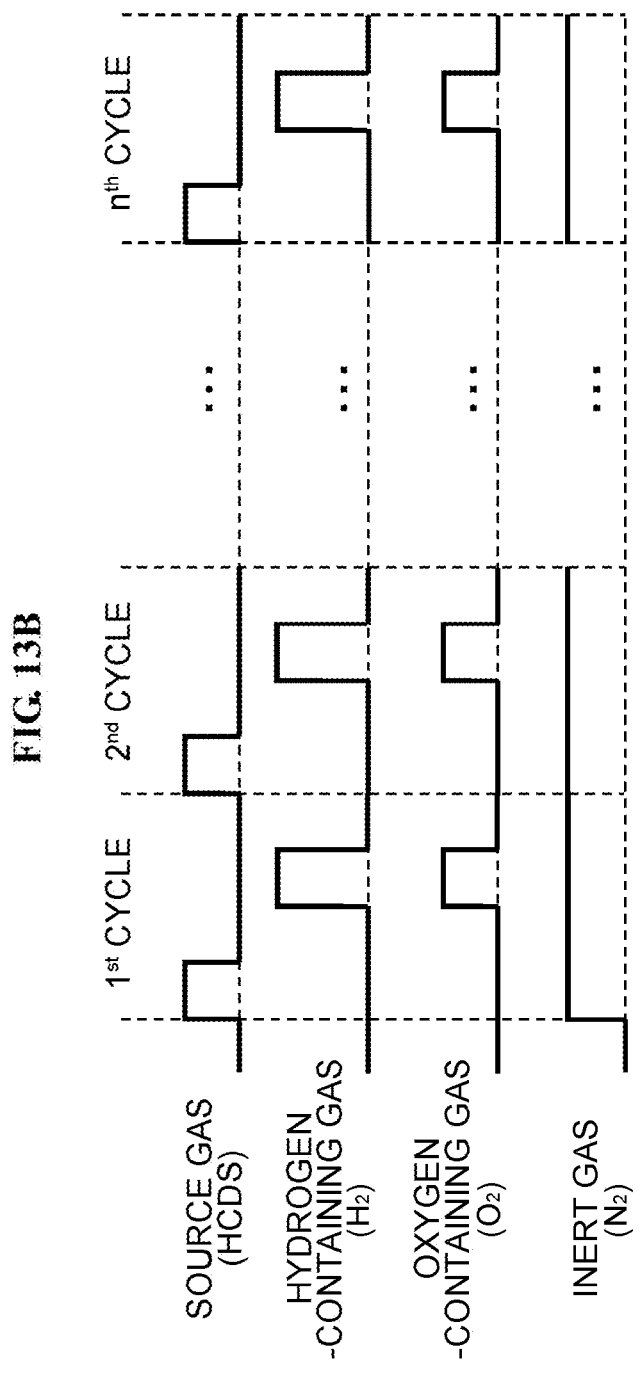

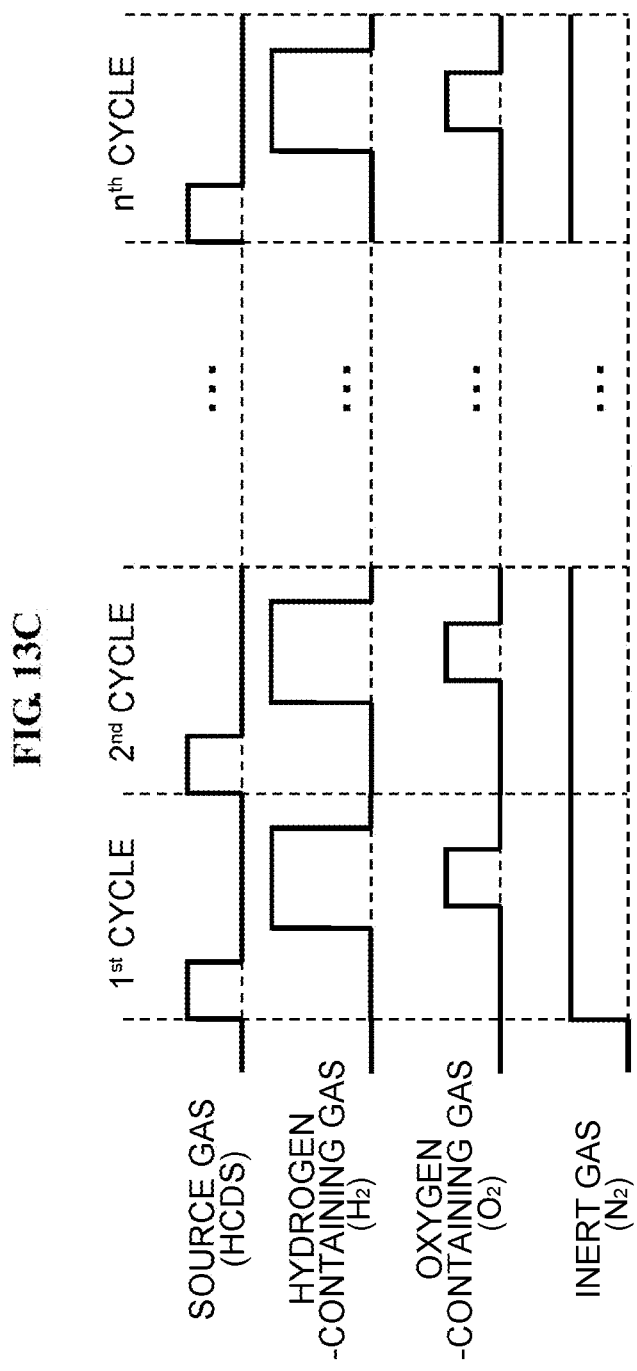

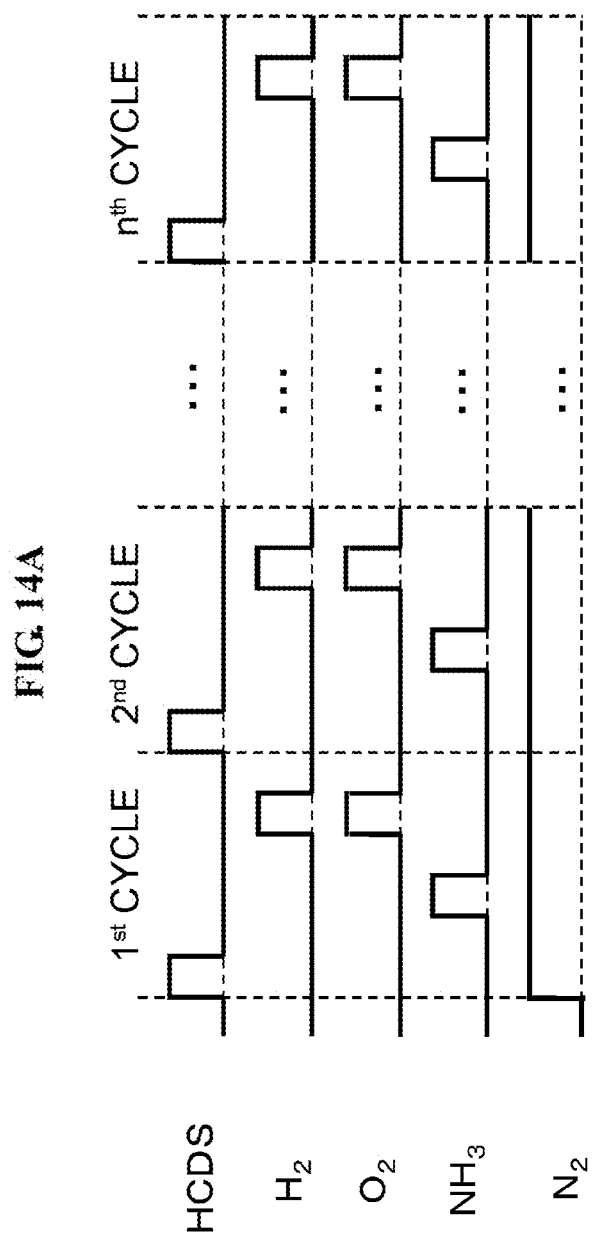

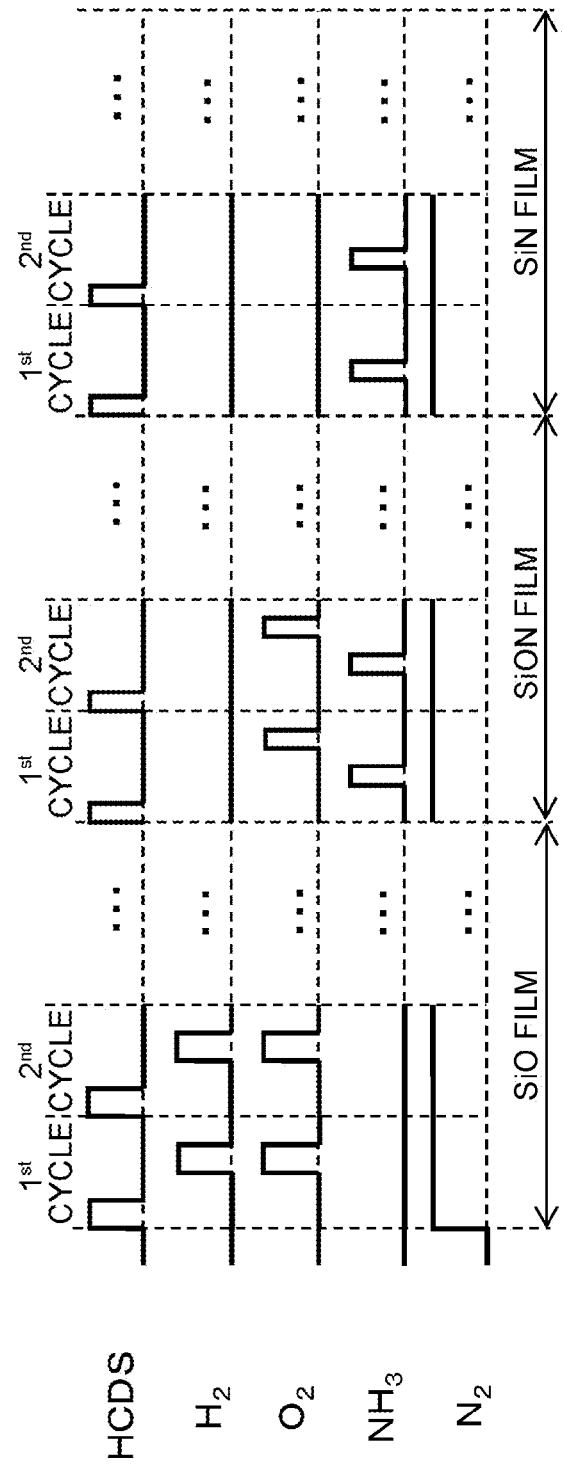

SUBSTRATE PROCESSING APPARATUS, METHOD OF MANUFACTURING SEMICONDUCTOR DEVICE, AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. § 119 of Japanese Patent Application No. 2013-117280 filed on Jun. 3, 2013 in the Japanese Patent Office, the entire contents of which are hereby incorporated by reference.

BACKGROUND OF THE INVENTION

1. Field of the Invention

The present invention relates to a substrate processing apparatus processing a substrate, a method of manufacturing a semiconductor device, and a non-transitory computer-readable recording medium.

2. Description of the Related Art

As a process among manufacturing processes of a semiconductor device, a substrate processing process in which a processing gas is supplied into a process chamber accommodating a plurality of substrates arranged at intervals and the plurality of substrates are batch-processed is performed.

In the above substrate processing process, a method of supplying a processing gas into a process chamber using a multi-hole nozzle having a plurality of gas supply holes with each of the gas supply holes corresponding to each substrate is known. When the multi-hole nozzle is used, it is possible to supply the processing gas in a uniform flow for each of the plurality of substrates, and promote supply of the processing gas to the vicinity of a center of each substrate. As a result, it is possible to improve inter-substrate uniformity or in-plane uniformity of substrate processing.

However, depending on types of the processing gas, even when the gas is supplied using the multi-hole nozzle, the inter-plane uniformity or the in-plane uniformity in substrate processing may not be sufficiently improved. Specifically, when a hydrogen-containing gas and an oxygen-containing gas are used as the processing gas, even if the gas is supplied using the multi-hole nozzle, the in-plane uniformity or the inter-plane uniformity in the substrate processing may not be sufficiently improved. By reducing the number of batch-processed substrates, it is possible to prevent degradation of in-plane uniformity or inter-plane uniformity. However, in this case, the productivity of substrate processing may be decreased.

SUMMARY OF THE INVENTION

The present invention is provided to improve inter-plane uniformity and in-plane uniformity of substrate processing without decreasing the productivity of substrate processing when the hydrogen-containing gas and the oxygen-containing gas are supplied into a process chamber accommodating a plurality of substrates to process a substrate.

According to an aspect of the present invention, there is provided a substrate processing apparatus including:

a process chamber configured to accommodate and process a plurality of substrates arranged with intervals therebetween;

a first nozzle extending along a stacking direction of the plurality of substrates and configured to supply a hydrogen-containing gas into the process chamber; and a second nozzle extending along the stacking direction of the plurality of substrates and configured to supply an oxygen-containing gas into the process chamber, wherein the first nozzle includes a plurality of first gas supply holes disposed in a region extending from an upper portion to a lower portion of the first nozzle corresponding to a substrate arrangement region where the plurality of substrates are arranged wherein the plurality of first gas supply holes are configured to supply the hydrogen-containing gas toward the plurality of substrates, and the second nozzle includes a plurality of second gas supply holes disposed at an upper portion and a lower portion of the second nozzle to correspond to upper substrates and lower substrates of the plurality of substrates wherein the plurality of second gas supply holes are configured to supply the oxygen-containing gas toward the plurality of substrates.

According to another aspect of the present invention, there is provided a method of manufacturing a semiconductor device, including:

(a) accommodating a plurality of substrates arranged with intervals therebetween in a process chamber; and (b) supplying a hydrogen-containing gas and an oxygen-containing gas into the process chamber under heated atmosphere at a pressure lower than an atmospheric pressure to process the plurality of substrates, wherein the step (b) includes:

supplying the hydrogen-containing gas into the process chamber through a first nozzle including a plurality of first gas supply holes disposed in a region extending from an upper portion to a lower portion of the first nozzle corresponding to a substrate arrangement region where the plurality of substrates are arranged, wherein the plurality of first gas supply holes are configured to supply the hydrogen-containing gas toward the plurality of substrates; and supplying the oxygen-containing gas into the process chamber through a second nozzle including a plurality of second gas supply holes disposed at an upper portion and a lower portion of the second nozzle to correspond to upper substrates and lower substrates of the plurality of substrates wherein the plurality of second gas supply holes are configured to supply the oxygen-containing gas toward the plurality of substrates.

According to still another aspect of the present invention, there is provided a non-transitory computer-readable recording medium storing a program that causes a computer to perform:

(a) accommodating a plurality of substrates arranged with intervals therebetween in a process chamber; and (b) supplying a hydrogen-containing gas and an oxygen-containing gas into the process chamber under heated atmosphere at a pressure lower than an atmospheric pressure to process the plurality of substrates, wherein the sequence (b) includes:

supplying the hydrogen-containing gas into the process chamber through a first nozzle including a plurality of first gas supply holes disposed in a region extending from an upper portion to a lower portion of the first nozzle corresponding to a substrate arrangement region where the plurality of substrates are arranged, wherein the plurality of first gas supply holes are configured to supply the hydrogen-containing gas toward the plurality of substrates; and supplying the oxygen-containing gas into the process chamber through a second nozzle including a plurality of second gas supply holes disposed at an upper portion and a lower portion of the second nozzle to correspond to upper substrates and lower substrates of the plurality of substrates wherein the plurality of second gas supply holes are configured to supply the oxygen-containing gas toward the plurality of substrates.

BRIEF DESCRIPTION OF THE DRAWINGS

FIG. 4A is a diagram illustrating a schematic configuration of a second nozzle of the substrate processing apparatus according to the embodiment of the present invention, and FIGS. 4A through 4E are diagrams illustrating modifications thereof.

FIG. 5A is a diagram illustrating a gas supply timing in a film-forming sequence according to an embodiment of the present invention, and FIGS. 5B and 5C are diagrams illustrating a gas supply timing in a film-forming sequence according to another embodiment of the present invention.

FIG. 6 is a cross-sectional view of a vertical processing furnace of a conventional substrate processing apparatus.

FIG. 9 is a diagram illustrating an analysis model for analyzing a distance (time) in which atomic oxygen is generated and an analysis result thereof.

FIG. 11 is a diagram illustrating a measurement result of an in-plane film thickness distribution of a SiO film, FIG. 1 IA is a diagram illustrating a comparative example, and FIG. 11B is a diagram illustrating an example.

FIGS. 13A through 13C are diagrams illustrating a gas supply timing in a film-forming sequence according to another embodiment of the present invention.

FIGS. 14A through 14D are diagrams illustrating a gas supply timing in a film-forming sequence according to another embodiment of the present invention.

DETAILED DESCRIPTION OF THE PREFERRED EMBODIMENTS

Embodiment of the Present Invention

Hereinafter, an embodiment of the present invention will be described with reference to FIGS. 1 through 4.

(1) Configuration of Substrate Processing Apparatus

Figure 1:
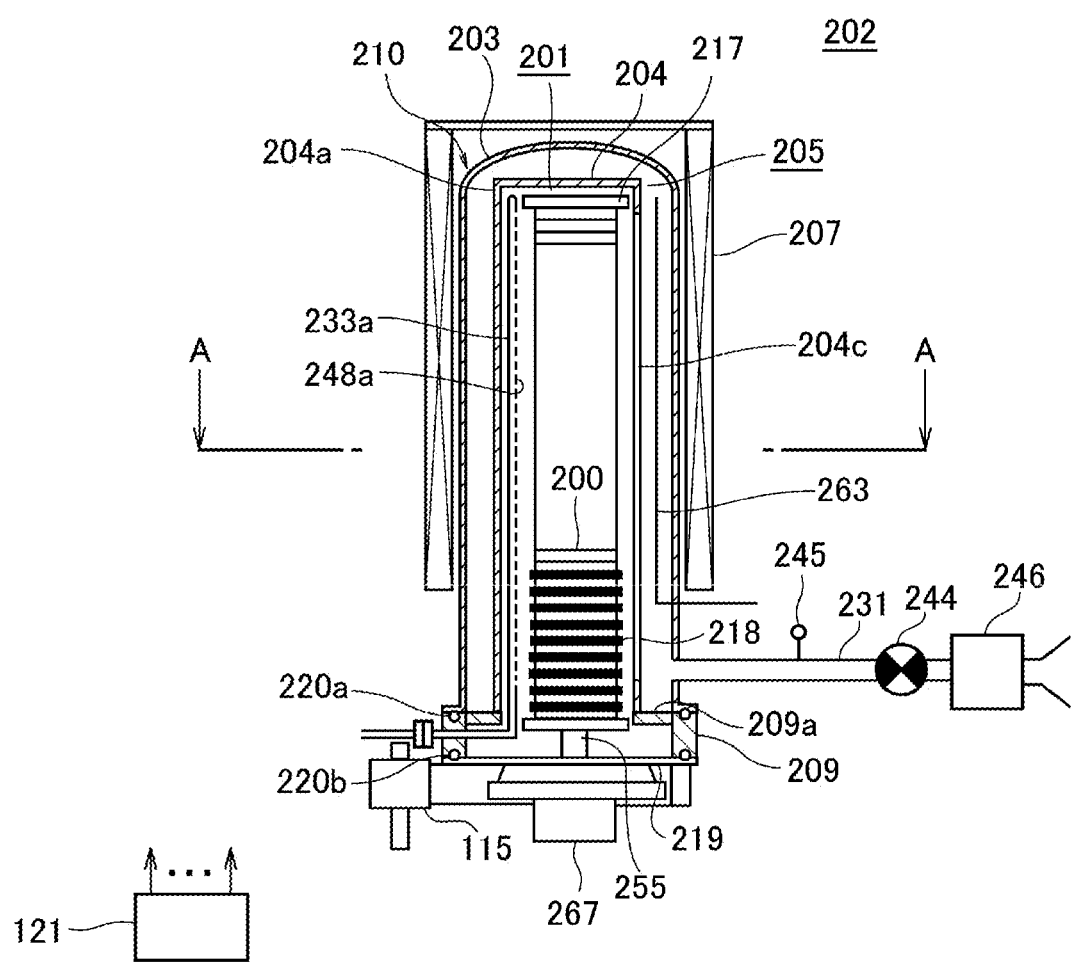
FIG. 1 is a diagram illustrating a schematic configuration of a vertical processing furnace of a substrate processing apparatus according to an embodiment of the present invention and is a vertical cross-sectional view illustrating a processing furnace part.

As illustrated in FIG. 1, a processing furnace 202 includes a heater 207 serving as a heating unit (heating mechanism). The heater 207 has a cylindrical shape and is vertically installed by being supported by a heater base (not illustrated) serving as a holding plate. As will be described below, the heater 207 also functions as an activating mechanism for activating (exciting) a gas by heat.

In the heater 207, a reaction tube 210 (process tube) forming a reaction container (process container) is concentrically provided with respect to the heater 207. The reaction tube 210 is made of a double-tube configuration including an inner tube 204 and an outer tube 203 concentrically surrounding the inner tube 204. The inner tube 204 and the outer tube 203 are made of a heat-resistant material such as quartz ($SiO_2$) and silicon carbide (SiC), and are formed to have a cylindrical shape whose upper end is closed and lower end is opened.

The inner tube 204 and the outer tube 203 are supported from below by a manifold 209. The manifold 209 is made of a metal material such as stainless steel (SUS), and is formed to have a cylindrical shape whose upper end and lower end are opened. In an upper end of an inner wall of the manifold 209, a flange portion 209a made of a metal material such as stainless steel (SUS) and having a ring shape extending in a radially inward direction with respect to the manifold 209 is provided. A lower end of the inner tube 204 abuts a metal part of an upper surface of the flange portion 209a. A lower end of the outer tube 203 abuts a metal part of an upper end of the manifold 209. An O ring 220a serving as a seal member is provided between the outer tube 203 and the manifold 209. A lower end opening of the manifold 209 is configured as a furnace port of the processing furnace 202, and is hermetically sealed by a seal cap 219 having a disk shape serving as a lid when a boat elevator 115 to be described is raised. An O ring 220b serving as a seal member is provided between the manifold 209 and the seal cap 219.

A process chamber 201 processing a wafer 200 serving as a substrate is formed in a cylindrical hollow portion of the inner tube 204. The process chamber 201 is configured to accommodate a boat 217 to be described later that vertically arranges (aligns) and holds the plurality of wafers 200 at intervals in a horizontal posture.

A ceiling portion of the inner tube 204 is formed in a flat shape and a ceiling portion of the outer tube 203 is formed in a dome shape. When the ceiling portion of the inner tube 204 is formed in a dome shape, a gas supplied into the process chamber 201 does not flow between the plurality of wafers 200 and is easily introduced into an internal space [a space above a top plate of the boat 217 to be described later] of a dome part formed in the ceiling portion of the inner tube 204. When the ceiling portion of the inner tube 204 is formed in a flat shape, a gas supplied into the process chamber 201 may be efficiently flowed between the plurality of wafers 200. Also, in this case, when a clearance (space) between the ceiling portion of the inner tube 204 and the top plate of the boat 217 is set to be smaller, for example, a size similar to an arrangement interval (pitch between arranged wafers) of the wafers 200, it is possible to further efficiently flow a gas between the wafers 200.

Figure 2:
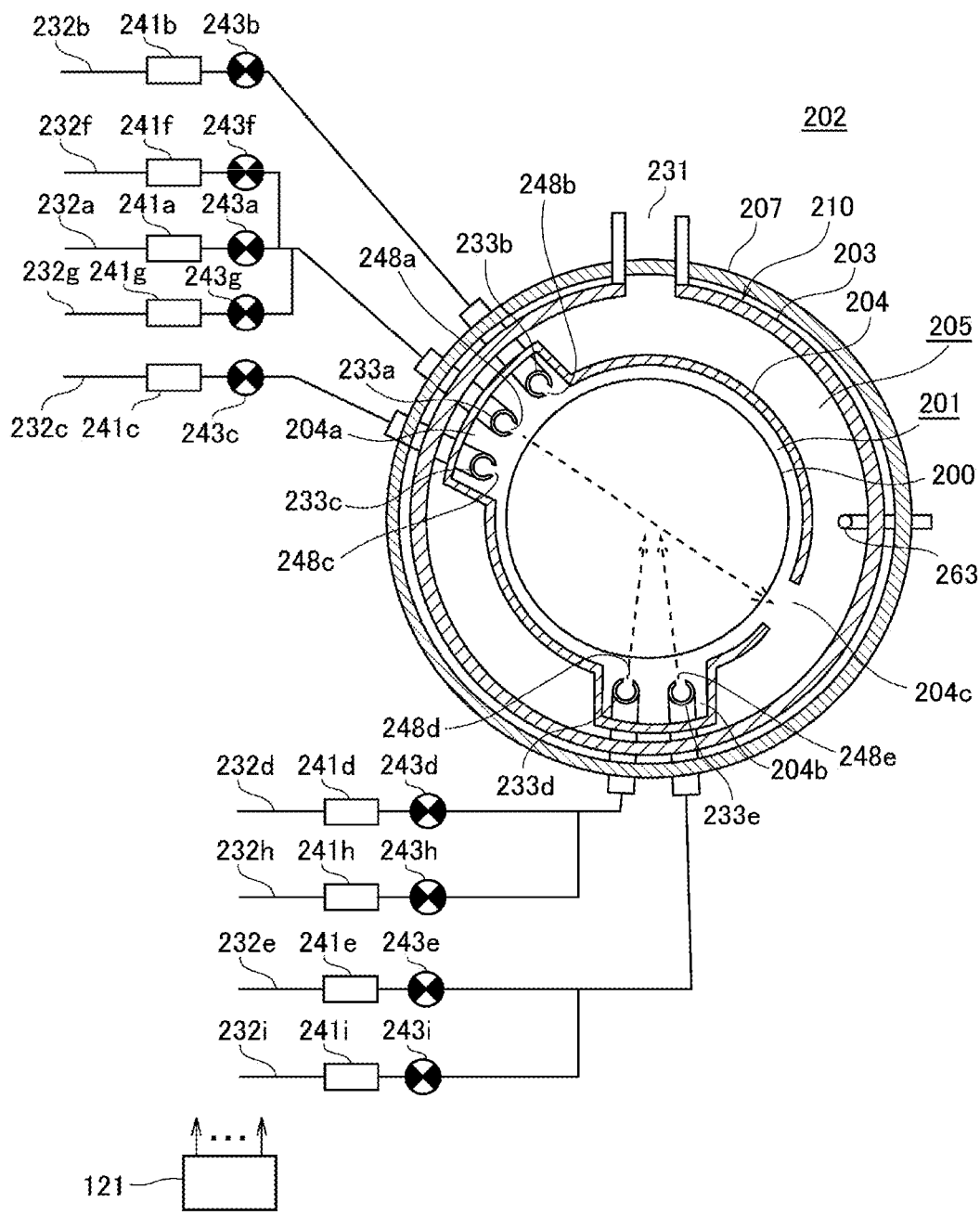
FIG. 2 is a diagram illustrating a schematic configuration of the vertical processing furnace of the substrate processing apparatus according to the embodiment of the present invention and is a cross-sectional view illustrating the processing furnace part taken along the line A-A in FIG. 1.

As illustrated in FIG. 2, at a sidewall of the inner tube 204, a nozzle accommodating chamber 204a accommodating nozzles 233a through 233c and a nozzle accommodating chamber 204b accommodating nozzles 233d and 233e are formed. The nozzle accommodating chambers 204a and 204b protrude in a radially outward direction with respect to the inner tube 204 from the sidewall of the inner tube 204, and are formed in a channel shape extending in a vertical direction. Inner walls of the nozzle accommodating chambers 204a and 204b form a part of an inner wall of the process chamber 201. In addition, the nozzle accommodating chamber 204a and the nozzle accommodating chamber 204b are disposed at positions separated by a predetermined distance, along the inner wall of the inner tube 204, that is, an outer circumference of the wafer 200 accommodated in the process chamber 201. Specifically, the nozzle accommodating chambers 204a and 204b are disposed at positions at which a central angle [a central angle of an arc having centers of the nozzle accommodating chambers 204a and 204b as both ends] formed by a straight line connecting a center of the wafer 200 and a center of the nozzle accommodating chamber 204a and a straight line connecting a center of the wafer 200 and a center of the nozzle accommodating chamber 204b becomes, for example, 30° to 150°.

The nozzles 233a through 233e are configured as L-shaped long nozzles. Each horizontal portion of the nozzles 233a through 233e is provided to penetrate a sidewall of the manifold 209.

Each vertical portion of the nozzles 233a through 233c is provided in the nozzle accommodating chamber 204a from a bottom to a top of the nozzle accommodating chamber 204a, so as to rise in a direction in which the wafers 200 are arranged. In addition, each vertical portion of the nozzles 233d and 233e is provided in the nozzle accommodating chamber 204b, from a bottom to a top of the nozzle accommodating chamber 204b, so as to rise in a direction in which the wafers 200 are arranged. That is, each vertical portion of the nozzles 233a through 233e is provided along a wafer arrangement region in a region that horizontally surrounds the wafer arrangement region at sides of the wafer arrangement region in which the wafers 200 are arranged. In addition, the nozzles 233d and 233e are provided at positions a predetermined distance from the nozzles 233a through 233c along an outer circumference of the wafer 200 accommodated in the process chamber 201. Also, the nozzle 233a is provided between the nozzles 233b and 233c. That is, the nozzle 233a is interposed between the pair of nozzles 233b and 233c at both sides in a circumferential direction of the wafer 200.

In a side surface of each vertical portion of the nozzles 233a through 233c, at least the same number of gas supply holes 248a through 248c as the plurality of wafers 200 are provided in an entire region from a top to a bottom of the nozzles 233a through 233c, so as to correspond one-to-one (respectively) to the plurality of wafers 200 accommodated in the process chamber 201. That is, the nozzles 233a through 233c are configured as the multi-hole nozzle. When the boat 217 holds, for example, 120 of the wafers 200, at least 120 of each of the gas supply holes 248a through 248c are provided in side surfaces of the vertical portions of the nozzles 233a through 233c. Also, as illustrated in FIG. 1, the gas supply holes 233a through 233c may be provided not only in the wafer arrangement region but also below the wafer arrangement region.

For example, the gas supply holes 248a through 248c may be configured such that each of them is opened to a center of the process chamber 201 and supplies a gas toward a center of the wafer 200. Also, for example, the gas supply holes 248a through 248c may have the same area and may be provided at the same pitch. In such a configuration, it is possible to promote supply of a gas to the vicinity of the center of each wafer 200 and improve in-plane uniformity of the wafer of substrate processing to be described later. Also, a flow rate or a flow velocity of a gas supplied to each wafer 200 is easily uniformized between the wafers 200 so that it is possible to improve inter-plane uniformity of the wafer of substrate processing to be described later.

In a side surface of the vertical portion of the nozzle 233d, at least one, and preferably a plurality, gas supply hole 248d is provided at only a top of the nozzle 233d, that is, only in the vicinity of an upper end of the nozzle 233d so as to correspond to only the wafer 200 that is arranged at the top out of the plurality of wafers 200 accommodated in the process chamber 201. Also, in a side surface of the vertical portion of the nozzle 233e, at least one, and preferably a plurality, gas supply hole 248e is provided at only a bottom of the nozzle 233e, that is, only in the vicinity of a lower end of the nozzle 233e so as to correspond to only the wafer 200 that is arranged at the bottom out of the plurality of wafers 200 accommodated in the process chamber 201. Also, the gas supply hole 248d may not be provided at a center and a bottom of the nozzle 233d. In addition, the gas supply hole 248e may not be provided at a top and a center of the nozzle 233e. FIG. 4A is a diagram illustrating an exemplary side surface configuration of the nozzles 233d and 233e seen from the wafer side accommodated in the process chamber 201. When the boat 217 holds, for example, 120 of the wafers 200, for example, 1 to 40, and preferably 30 to 40, of the gas supply holes 248d are provided at the top of the nozzle 233d, so as to correspond to the wafers 200 arranged at the top one-to-one. Also, for example, 1 to 40, and preferably 30 to 40, of the gas supply holes 248e are provided at the bottom of the nozzle 233e, so as to correspond to the wafers 200 arranged at the bottom one-to-one.

For example, each of the gas supply holes 248d and 248e is opened to the center of the process chamber 201 and is configured to supply a gas toward the center of the wafer 200. In addition, when a plurality, such as 30 to 40, of each of the gas supply holes 248d and 248e are provided, the gas supply holes 248d and 248e may be configured such that, for example, each has the same area and is provided at the same pitch.

In addition, in order to prevent gas retention for a long time in the nozzles 233a through 233e, known as residual of the gas, it is preferable to provide a gas vent hole 248h at each upper end of the nozzles 233a through 233e, as exemplified in FIG. 4A.

Gas supply pipes 232a through 232e are connected to the nozzles 233a through 233e, respectively. A gas supply pipe 232f is connected to the gas supply pipe 232a. In the gas supply pipes 232a through 232f, in order from an upstream end, mass flow controllers 241a through 241f (MFCs) serving as flow rate controllers (flow rate control units) and valves 243a through 243f serving as on-off valves are provided. Gas supply pipes 232g to 232i configured to supply an inert gas are connected downstream from the valves 243a, 243d, and 243e of the gas supply pipes 232a, 232d, and 232e, respectively. In the gas supply pipes 232g to 232i, in order from an upstream end, MFCs 241g to 241i serving as a flow rate controller (flow rate control unit) and valves 243g to 243i serving as an on-off valve are provided.

From the gas supply pipe 232a, as a source gas containing a predetermined element, for example, a chlorosilane-based source gas that contains silicon (Si) as a predetermined element and chlorine (Cl) as a halogen element, is supplied into the process chamber 201 through the MFC 241a, the valve 243a, and the nozzle 233a. Here, the chlorosilane-based source gas refers to a chlorosilane-based material in a gas state, for example, a gas that is obtained by vaporizing a chlorosilane-based material that is in a liquid state under normal temperature and normal pressure, a chlorosilane-based material in a gas state under normal temperature and normal pressure, and the like. In addition, the chlorosilane-based material is a silane-based material including a chloro group as a halogen group and is a source including at least Si and Cl. That is, the chlorosilane-based material referred to herein may be a kind of halide. Also, in this specification, the term "source" may refer to either or both of "a liquid source in a liquid state" and "a source gas in a gas state." Therefore, in this specification, the term "chlorosilane-based material" may refer to either or both of "a chlorosilane-based material in a liquid state" and "a chlorosilane-based source gas in a gas state." As the chlorosilane-based material, for example, hexachlorodisilane ($Si_2Cl_6$, abbreviated as HCDS) may be used. Also, when a liquid source that is in a liquid state under normal temperature and normal pressure such as HCDS is used, the liquid source is vaporized by a vaporization system such as a vaporizer and a bubbler and is supplied as a source gas (HCDS gas).

From the gas supply pipe 232f, a hydrogen-containing gas (reducing gas) is supplied into the process chamber 201 through the MFC 241f, the valve 243f, the gas supply pipe 232a, and the nozzle 233a. As the hydrogen-containing gas, for example, hydrogen ($H_2$) gas may be used.

From the gas supply pipes 232d and 232e, an oxygen-containing gas (oxidizing gas) is supplied into the process chamber 201 through MFCs 241d and 241e, the valves 243d and 243e, and the nozzle 233d and 233e. As the oxygen-containing gas, for example, oxygen ($O_2$) gas may be used.

From the gas supply pipes 232b and 232c, for example, nitrogen ($N_2$) gas is supplied as an inert gas into the process chamber 201 through the MFCs 241b and 241c, the valves 243b and 243c, and the nozzles 233b and 233c. Similarly, from the gas supply pipes 232g to 232i, for example, $N_2$ gas is supplied as the inert gas into the process chamber 201 through the MFCs 241g to 241i, the valves 243g to 243i, the gas supply pipes 232a, 232d, and 232e, and the nozzles 233a. 233d, and 233e.

When the gas described above flows from each gas supply pipe, the gas supply pipe 232a, the MFC 241a, and the valve 243a mainly constitute a source gas supply system configured to supply a source gas containing a predetermined element, that is, a chlorosilane-based source gas supply system. The nozzle 233a may be further included in the chlorosilane-based source gas supply system. The source gas supply system may also be called a source supply system, and the chlorosilane-based source gas supply system may also be called a chlorosilane-based material supply system.

In addition, the gas supply pipe 232f, the MFC 241f, and the valve 243f mainly constitute a hydrogen-containing gas supply system. Also, the nozzle 233a downstream from a unit connecting the gas supply pipe 232f in the gas supply pipe 232a may be included in the hydrogen-containing gas supply system. The nozzle 233a may be considered as a first nozzle configured to supply a hydrogen-containing gas into the process chamber 201. Also, the gas supply hole 248a may be considered as a first gas supply hole provided in the first nozzle. In this manner, the nozzle 233a according to this embodiment is configured to be shared by the source gas supply system and the hydrogen-containing gas supply system.

In addition, the gas supply pipes 232d and 232e, the MFCs 241d and 241e, and the valves 243d and 243e mainly constitute an oxygen-containing gas supply system. The nozzles 233d and 233e may be further included in the oxygen-containing gas supply system. The nozzles 233d and 233e may be considered as a second nozzle configured to supply an oxygen-containing gas into the process chamber 201. Also, the gas supply holes 248d and 248e may be considered as a second gas supply hole provided in the second nozzle. In addition, the nozzle 233d may be considered as an upper opening nozzle including at least one second gas supply hole that is provided at only the top, so as to correspond to only the wafer 200 that is arranged at the top out of the plurality of wafers 200. Also, the nozzle 233e may be considered as a lower opening nozzle including at least one second gas supply hole that is provided at only the bottom, so as to correspond to only the wafer 204) that is arranged at the bottom out of the plurality of wafers 200. In addition, in the oxygen-containing gas supply system, since each of the gas supply pipes 232d and 232e includes the MFC, it is possible to independently control a flow rate of the oxygen-containing gas supplied from the nozzle 233d and a flow rate of the oxygen-containing gas supplied from the nozzle 233e. That is, the oxygen-containing gas supply system may freely regulate a ratio (flow rate balance) of the flow rate of the oxygen-containing gas supplied from the nozzle 233d and the flow rate of the oxygen-containing gas supplied from the nozzle 233e.

In addition, the gas supply pipes 232b, 232c, and 232g to 232i, the MFCs 241b, 241c, and 241g to 241i, and the valves 243b, 243c, and 243g to 243i mainly constitute an inert gas supply system. Also, the nozzles 233a through 233e downstream from a unit connecting the gas supply pipes 232g to 232i in the gas supply pipes 232a, 232d, and 232e may be included in the inert gas supply system. The inert gas supply system may also function as a purge gas supply system. In addition, when gas supply from the gas supply pipe 232a and gas supply from the gas supply pipes 232b and 232c are simultaneously performed, the inert gas supplied from the gas nozzles 233b and 233c flows to surround the source gas supplied from the nozzle 233a on both sides, and acts to control a flow path, a diffusion condition, directivity, and the like of the source gas in the process chamber 201. Therefore, the gas supply pipes 232b and 232c, the MFCs 241b and 241c, and the valves 243b and 243c may be considered as a flow path control gas supply system that controls a flow path and the like of the source gas in the process chamber 201, or may be considered as a part of the source gas supply system. In this case, the nozzles 233b and 233c may be considered as a pair of auxiliary nozzles included in the flow path control gas supply system or the source gas supply system.

In a sidewall of the inner tube 204, an exhaust hole 204c that is a through-hole having a slit shape is opened and elongated in a vertical direction. The exhaust hole 204c has a rectangular shape in a front view, and is provided from the upper sidewall to the lower sidewall of the inner tube 204, so as to correspond to at least a part in which the gas supply hole 248a of the nozzle 233a is provided. In addition, the exhaust hole 204c may be provided to correspond to the part in which the gas supply hole 248a of the nozzle 233a is provided and may be provided to correspond to a lower side thereof. In such a configuration, even when particles (foreign matters) are generated in a lower part in the process chamber 201, it is easy to suppress upward spinning of the particles.

An inside of the process chamber 201 and an exhaust space 205 that is a space having a cylindrical shape between the inner tube 204 and the outer tube 203 communicate through the exhaust hole 204c. In addition, the nozzle 233a is provided at a position facing the exhaust hole 204c with respect to the center of the wafer 200 accommodated in the inner tube 204. In other words, a straight line connecting the nozzle 233a and the exhaust hole 204c, that is, a main flow path (a center of a source gas flow diffusing in a fan shape) of the source gas, is configured to pass an upper center of the wafer 200 accommodated in the inner tube 204. Also, the nozzles 233d and 233e are provided at positions that do not face the exhaust hole 204c with respect to the center of the wafer 200 accommodated in the inner tube 204. In other words, the nozzles 233d and 233e are not provided on the straight line connecting the center of the wafer 200 accommodated in the inner tube 204 and the exhaust hole 204c but are provided at a position closer to the exhaust hole 204c than the nozzle 233a.

At the bottom of the outer tube 203, an exhaust pipe 231 configured to exhaust an atmosphere in the process chamber 201 is provided through the exhaust space 205. In the exhaust pipe 231, a vacuum pump 246 serving as a vacuum-exhaust device is connected through a pressure sensor 245 serving as a pressure detector (pressure detecting unit) configured to detect an inside pressure of the exhaust space 205, that is, in the process chamber 201, and an auto pressure controller (APC) valve 244 serving as a pressure regulator (pressure regulating unit). Also, the APC valve 244 is a valve that can perform vacuum-exhaust and vacuum-exhaust stop in the process chamber 201 by opening or closing a valve while the vacuum pump 246 is operated, and regulate an inside pressure of the process chamber 201 by adjusting a degree of valve opening based on information on pressure detected by the pressure sensor 245 while the vacuum pump 246 is operated. The exhaust pipe 231, the APC valve 244, and the pressure sensor 245 mainly constitute an exhaust system. The exhaust hole 204c, the exhaust space 205, and the vacuum pump 246 may be further included in the exhaust system.

In this manner, in this embodiment, a gas is transferred through a longitudinally extending space having a cylindrical shape defined by the inner wall of the inner tube 204 and ends (outer circumferences) of the plurality of wafers 200, that is, the nozzles 233a through 233e arranged in the nozzle accommodating chambers 204a and 204b communicating (adjacent) with a space having a cylindrical shape. Then, from the gas supply holes 248a through 248e that open to the nozzles 233a through 233e, respectively, a gas is initially sprayed into the process chamber 201 in the vicinity of the wafer 200. Then, from the exhaust hole 204c that opens to a position facing the nozzles 233a through 233c with respect to the wafer 200, an atmosphere in the inner tube 204 is exhausted. In this manner, a main flow of the gas in the inner tube 204, that is, in the process chamber 201, is easily set in a direction parallel to a surface of the wafer 200, that is, a horizontal direction. As a result, it is possible to uniformly supply a gas to each wafer 200, and promote gas supply to the vicinity of the center of each wafer 200. Also, a gas flowing along an upper surface of the wafer 200, that is, a residual gas after reaction, flows into the exhaust space 205 through the exhaust hole 204c, and then flows to an exhaust port, that is, in a direction of the exhaust pipe 231. The direction in which the residual gas flows in the exhaust space 205 is appropriately specified according to a position of the exhaust port and is not limited to the vertical direction.

As described above, the lower end opening of the manifold 209 is hermetically sealed by the seal cap 219 through the O ring 220b. The seal cap 219 is made of a metal material such as stainless steel (SUS) and is formed in a disk shape. A rotating mechanism 267 configured to rotate the boat 217 to be described later is provided in a side opposite to the manifold 209 of the seal cap 219. A rotary shaft 255 of the rotating mechanism 267 penetrates the seal cap 219 and is connected to the boat 217. The rotating mechanism 267 is configured to rotate the wafer 200 by rotating the boat 217. The seal cap 219 is configured to be raised or lowered in a vertical direction by the boat elevator 115 serving as a lifting mechanism that is vertically provided at the outside of a reaction tube 210. The boat elevator 115 may load or unload the boat 217 into or from the process chamber 201 by raising or lowering the seal cap 219. That is, the boat elevator 115 is configured as a transfer device (transfer mechanism) that transfers the boat 217, that is, the wafer 200, into or out of the process chamber 201.

The boat 217 serving as a substrate support is configured to support the plurality of wafers 200, for example, 100 to 150 wafers, that are arranged in a horizontal posture and in a vertical direction in a state in which centers thereof are aligned in multiple stages, that is, to support the wafers arranged at intervals. The boat 217 is made of a heat-resistant material such as quartz and SiC. Also, an insulation plate 218 made of a heat-resistant material such as quartz and SiC is horizontally supported in multiple stages at the bottom of the boat 217 and is configured such that heat from the heater 207 is not easily delivered to the seal cap 219. Also, the insulation plate 218 may not be provided at the bottom of the boat 217 but an insulation tube configured as a tubular member made of a heat-resistant material such as quartz and SiC may be provided.

A temperature sensor 263 serving as a temperature detector is provided between the outer tube 203 and the inner tube 204. By regulating power supply to the heater 207 based on information on temperature detected by the temperature sensor 263, a temperature in the process chamber 201 is set to have a desired temperature distribution. Similar to the nozzles 233a through 233e, the temperature sensor 263 is configured in an L shape and is provided along an inner wall of the outer tube 203.

Figure 3:
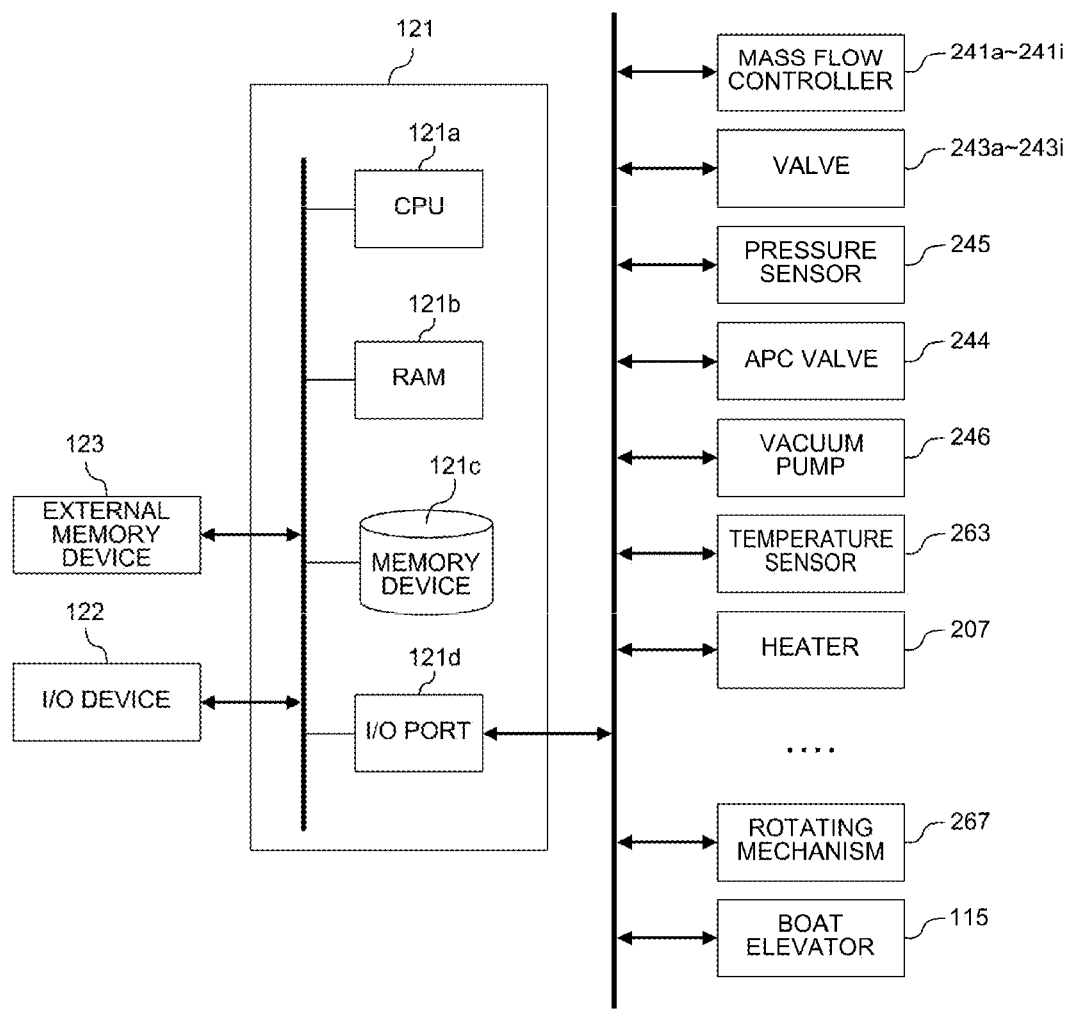
FIG. 3 is a diagram illustrating a schematic configuration of a controller of a substrate processing apparatus according to an embodiment of the present invention and is a block diagram of a control system of the controller.

As illustrated in FIG. 3, a controller 121 serving as a control unit (control device) is configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a through an internal bus 121e. An I/O device 122 configured as, for example, a touch panel, is connected to the controller 121.

The memory device 121c is configured as, for example, a flash memory and a hard disk drive (HDD). A control program controlling operations of the substrate processing apparatus, a process recipe describing sequences, conditions, and the like, of substrate processing to be described later, and the like are readably stored in the memory device 121c. In addition, the process recipe, which is a combination of sequences, causes the controller 121 to execute each sequence in a substrate processing process to be described later in order to obtain a predetermined result, and functions as a program. Hereinafter, the process recipe, the control program, and the like are collectively simply called a "program." Also, in this specification, the term "program"

may refer to only the process recipe, only the control program, or both of them. In addition, the RAM 121*b* is configured as a memory area (work area) in which a program, data, and the like read by the CPU 121*a* are temporarily stored.

The I/O port 121*d* is connected to the MFCs 241*a* through 241*i*, the valves 243*a* through 243*i*, the pressure sensor 245, the APC valve 244, the vacuum pump 246, the heater 207, the temperature sensor 263, the rotating mechanism 267, the boat elevator 115, and the like.

The CPU 121*a* reads and executes the control program from the memory device 121*c*, and reads the process recipe from the memory device 121*c* according to an input of a manipulating command from the I/O device 122 and the like. To comply with content of the read process recipe, the CPU 121*a* controls a flow rate regulating operation of various types of gases by the MFCs 241*a* through 241*i*, an opening and closing operation of the valves 243*a* through 243*i*, an opening and closing operation of the APC valve 244, a pressure regulating operation by the APC valve 244 based on the pressure sensor 245, starting and stopping of the vacuum pump 246, a temperature regulating operation of the heater 207 based on the temperature sensor 263, a rotation and rotational speed regulating operation of the boat 217 by the rotating mechanism 267, a raising and lowering operation of the boat 217 by the boat elevator 115, and the like.

Also, the controller 121 is not limited to being configured as a dedicated computer but may be configured as a general-purpose computer. For example, the controller 121 according to this embodiment may be configured by preparing an external memory device 123 [for example, a magnetic tape, a magnetic disk such as a flexible disk and a hard disk, an optical disc such as a CD and a DVD, a magneto-optical disc such as an MO, and a semiconductor memory such as a USB memory and a memory card] recording the above program, and then installing the program in the general-purpose computer using the external memory device 123. Also, a method of supplying the program to the computer is not limited to using the external memory device 123. For example, a communication line such as the Internet or an exclusive line may be used to supply the program without using the external memory device. The memory device 121*c* or the external memory device 123 is configured as a non-transitory computer-readable recording medium. Hereinafter, these are also collectively simply called a recording medium. When the term "recording medium" is used in this specification, it refers to either or both of the memory device 121*c* and the external memory device 123.

(2) Substrate Processing Process

Next, as a process among manufacturing processes of a semiconductor apparatus (semiconductor device) using the processing furnace of the substrate processing apparatus described above, a sequence example in which a thin film is formed on a substrate will be described. Also, in the following description, operations of respective units constituting the substrate processing apparatus are controlled by the controller 121.

In this embodiment, a process of accommodating a plurality of substrates arranged at intervals in the process chamber, and a process of supplying the hydrogen-containing gas and the oxygen-containing gas into the process chamber under heated atmosphere having a pressure lower than an atmospheric pressure to process the plurality of substrates are sequentially performed.

In addition, in the process of processing the plurality of substrates, a process of supplying the source gas into the process chamber and a process of supplying the hydrogen-containing gas and the oxygen-containing gas into the process chamber under heated atmosphere having a pressure lower than an atmospheric pressure are alternately performed a predetermined number of times, and a process of forming an oxide film on the plurality of substrates is performed.

Hereinafter, a film-forming sequence of this embodiment will be described in detail with reference to FIG. 5A. FIG. 5A is a diagram illustrating a gas supply timing in a film-forming sequence according to this embodiment.

In addition, herein, an example in which HCDS gas is used as the source gas, $O_2$ gas is used as the oxygen-containing gas, and $H_2$ gas is used as the hydrogen-containing gas will be described. An example of forming a silicon oxide film ($SiO_2$ film, hereinafter referred to as a SiO film) having a predetermined composition and a predetermined film thickness on the wafer 200 by alternately performing a process of supplying the HCDS gas into the process chamber 201 accommodating the plurality of wafers 200 and forming a silicon-containing layer (Si-containing layer) on the plurality of wafers 200 as an initial layer, and a process of supplying $O_2$ gas and $H_2$ gas into the process chamber 201*t* under heated atmosphere having a pressure lower than an atmospheric pressure and changing the silicon-containing layer as the initial layer to a silicon oxide layer ($SiO_2$ layer, hereinafter referred to as a SiO layer), a predetermined number of times (at least once) will be described. Also, in the process of changing the silicon-containing layer to the SiO layer, an example in which $O_2$ gas and $H_2$ gas react to generate a water ($H_2O$)-free oxidizing species containing oxygen such as atomic oxygen (atomic oxygen, O) in the process chamber 201 200 under heated atmosphere having a pressure lower than an atmospheric pressure and this oxidizing species is used to change the silicon-containing layer to the SiO layer will be described.

Also, when the term "wafer" is used in this specification, it refers to "the wafer itself," or a "laminate (aggregate) of a wafer, a predetermined layer, film, and the like formed on a surface thereof" (that is, the wafer refers to a wafer including a predetermined layer, film, and the like formed on a surface thereof). In addition, when the term "surface of the wafer" is used in this specification, it refers to "a surface (exposed surface) of the wafer itself" or "a surface of a predetermined layer, film, and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film, and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film, and the like formed on the wafer, that is, a predetermined layer (or film) is formed on the outermost surface of the wafer as the laminate."

The terms "substrate" and "wafer" as used in this specification have the same meanings. Thus, the term "wafer" in the above description may be replaced with the term "substrate."

(Wafer Charging and Boat Loading)

When the plurality of wafers 200 are loaded (wafer charging) on the boat 217, the boat 217 by which the plurality of wafers 200 are supported is lifted by the boat elevator 115 and is loaded (boat loading) in the process chamber 201, as illustrated in FIG. 1. In this state, the seal cap 219 seals the lower end of the manifold 209 through the O ring 220b.

(Pressure Regulation and Temperature Regulation)

An inside pressure of the process chamber 201, that is, a pressure in a space in which the wafer 200 is present, is vacuum-exhausted to a desired pressure (degree of vacuum) by the vacuum pump 246. At this time, the inside pressure of the process chamber 201 is measured by the pressure sensor 245, and the APC valve 244 is feedback-controlled (pressure regulation) based on information on the measured pressure. The vacuum pump 246 is continuously operated while at least processing on the wafer 200 is completed. In addition, the wafer 200 in the process chamber 201 is heated to a desired temperature by the heater 207. At this time, based on information on the temperature detected by the temperature sensor 263, power supply to the heater 207 is feedback-controlled (temperature regulation) such that an inside of the process chamber 201 has a desired temperature distribution. Also, heating the inside of the process chamber 201 by the heater 207 is continuously performed while at least processing on the wafer 200 is completed. Subsequently, the rotating mechanism 267 starts to rotate the boat 217 and the wafer 200. Also, the rotating mechanism 267 continuously rotates the boat 217 and the wafer 200 while at least processing on the wafer 200 is completed.

(SiO Film Forming Process)

Then, the following steps 1 to 4 are sequentially performed.

[Step 1]

The valve 243a is opened to flow the HCDS gas into the gas supply pipe 232a. The HCDS gas having a flow rate regulated by the MFC 241a is supplied into the process chamber 201 in a heated and depressurized state from the gas supply hole 248a. Then, the HCDS gas flows into the exhaust space 205 through the exhaust hole 204c and is exhausted from the exhaust pipe 231. At this time, the HCDS gas is supplied to the wafer 200 (HCDS gas supply). At the same time, the valve 243g is opened to flow the $N_1$ gas into the gas supply pipe 232g. The $N_2$ gas having a flow rate regulated by the MFC 241g is supplied into the process chamber 201 together with the HCDS gas, and is exhausted from the exhaust pipe 231 through the exhaust hole 204c and the exhaust space 205.

At the same time, the valves 243b and 243c are opened to flow the $N_2$ gas into the gas supply pipes 232b and 232c. The $N_2$ gas having a flow rate regulated by the MFCs 241b and 241c is supplied into the process chamber 201 from the gas supply holes 248b and 248c. The HCDS gas supplied from the gas supply hole 248a is surrounded by the $N_2$ gas supplied from the gas supply holes 248b and 248c on both sides and a flow path thereof is restricted. For example, when the $N_2$ gas is supplied to an area (gap) between the outer circumference of the wafer 200 and the inner wall of the process chamber 201, a pressure in this area becomes relatively higher so that introduction (leakage) of the HCDS gas into the area between the outer circumference of the wafer 200 and the inner wall of the process chamber 201 is suppressed. As a result, supply of the HCDS gas to the vicinity of the center of each wafer 200 is promoted. In addition, by diluting the HCDS gas to an appropriate concentration with the $N_2$ gas in the gap between the outer circumference of the wafer 200 and the inner wall of the process chamber 201, it is possible to control a film thickness of a SiO film formed in the vicinity of the outer circumference of the wafer 200 to an appropriate film thickness.

Also, at this time, in order to prevent the HCDS gas from being introduced into the nozzles 233d and 233e, the valves 243h and 243i are opened to flow the $N_2$ gas into the gas supply pipes 232h and 232i. The $N_2$ gas is supplied into the process chamber 201 through the gas supply pipes 232d and 232e, and nozzles 233d and 233e, and is exhausted from the exhaust pipe 231 through the exhaust hole 204c and the exhaust space 205.

At this time, by appropriately regulating the APC valve 244, the inside pressure of the process chamber 201 is set to, for example, a range of 1 Pa to 13,300 Pa, and preferably, 10 Pa to 1,330 Pa. A supply flow rate of the HCDS gas controlled by the MFC 241a is set to a flow rate within, for example, a range of 1 sccm to 1,000 sccm. A supply flow rate of the $N_2$ gas controlled by the MFCs 241b, 241c, and 241g to 241i is set to a flow rate within, for example, a range of 100 sccm to 10,000 sccm. A time for which the HCDS gas is supplied to the wafer 200, that is, a gas supply time [radiation time] is set to, for example, a range of 1 to 120 seconds. In this case, the temperature of the heater 207 is set such that the temperature of the wafer 200 falls within, for example, a range of 350 CC to 800° C., preferably 450° C. to 800° C., and more preferably 550° C. to 750° C.

Also, when the temperature of the wafer 200 becomes less than 350° C., since the HCDS is not easily decomposed or adsorbed onto the wafer 200, a practical film formation speed may not be obtained. By setting the temperature of the wafer 200 to 350° C. or more, it is possible to address this problem, and a sufficient film formation speed may be obtained. Also, by setting the temperature of the wafer 200 to 450° C. or more, oxidizing power significantly increases in the following step 3. In addition, by setting the temperature of the wafer 200 to 550° C. or more, it is possible to sufficiently decompose the HCDS.

Also, when the temperature of the wafer 200 exceeds 750° C., and particularly, exceeds 800° C., a CVD reaction becomes strong [a gas-phase reaction is dominant], and thus film thickness uniformity is likely to be degraded and control thereof may be difficult. By setting the temperature of the wafer 200 to 800° C. or less, it is possible to suppress degradation of the film thickness uniformity and thereby control thereof is possible. In particular, by setting the temperature of the wafer 200 to 750° C. or less, the film thickness uniformity is easily secured and thereby control thereof becomes easy. Therefore, the temperature of the wafer 200 is preferably set to 350° C. to 800° C., more preferably 450° C. to 800° C., and most preferably 550° C. to 750° C.

Under the above conditions, when the HCDS gas is supplied to the wafer 200, a silicon-containing layer having a thickness of, for example, about less than one atomic layer to several atomic layers is formed on the wafer 200 [a base film of a surface]. The silicon-containing layer may include either or both of an adsorption layer of the HCDS gas and a Si layer. However, the silicon-containing layer is preferably a layer containing Si and Cl.

Here, the Si layer generically refers to a continuous layer formed of Si, a discontinuous layer, and a Si thin film formed by overlapping these layers. The continuous layer formed of Si may also be called a Si thin film. Si forming the Si layer also includes Si in which a bond with Cl is not completely disconnected.

In addition, the adsorption layer of the HCDS gas includes a chemical adsorption layer in which gas molecules of the HCDS gas are continuous and a chemical adsorption layer in which gas molecules of the HCDS gas are discontinuous. That is, the adsorption layer of the HCDS gas includes a chemical adsorption layer that is formed of the HCDS molecules and has a thickness of one molecular layer or less than one molecular layer. The HCDS molecules forming the adsorption layer of the HCDS gas also include molecules in which a bond between Si and Cl is partially disconnected.

Also, "layer having a thickness of less than one atomic layer" refers to a discontinuously formed atomic layer. Further, "layer having a thickness of one atomic layer" refers to a continuously formed atomic layer. In addition, "layer having a thickness of less than one molecular layer" refers to a discontinuously formed molecular layer. "Layer having a thickness of one molecular layer" refers to a continuously formed molecular layer.

Under conditions in which the HCDS gas is self-decomposed (pyrolyzed), that is, conditions causing a pyrolysis reaction of the HCDS, when Si is deposited on the wafer 200, the Si layer is formed. Under conditions in which the HCDS gas is not self-decomposed (pyrolyzed), that is, conditions that do not cause a pyrolysis reaction of the HCDS, when the HCDS gas is adsorbed onto the wafer 200, the adsorption layer of the HCDS gas is formed. Forming the Si layer on the wafer 200 is preferable since a film-forming rate is higher when the Si layer is formed on the wafer 200 than when the adsorption layer of the HCDS gas is formed on the wafer 200.

When the thickness of the silicon-containing layer formed on the wafer 200 is more than several atomic layers, an oxidation (modification) action in the following step 3 does not influence the entire silicon-containing layer. Also, a minimum thickness of the silicon-containing layer that can be formed on the wafer 200 is less than one atomic layer. Therefore, the thickness of the silicon-containing layer is preferably set to a thickness of less than one atomic layer to several atomic layers. Also, when the thickness of the silicon-containing layer is set to one atomic layer or less, that is, one atomic layer or less than one atomic layer, since an action of an oxidation reaction (modifying reaction) in the following step 3 relatively increases, it is possible to reduce a time required for the oxidation reaction in step 3. Also, a time required for forming the silicon-containing layer in step 1 may be decreased. As a result, it is possible to reduce a processing time required for performing one cycle, and it is possible to reduce a processing time in total. In other words, it is possible to increase the film-forming rate. In addition, when the thickness of the silicon-containing layer is set to one atomic layer or less, it is possible to increase controllability of the film thickness uniformity.

As the source gas (silicon-containing gas), instead of the HCDS gas, tetrachlorosilane (silicon tetrachloride, $SiCl_4$, abbreviated as STC) gas, trichlorosilane ($SiHCl_3$, abbreviated as TCS) gas, dichlorosilane ($SiH_2Cl_2$, abbreviated as DCS) gas, and monochlorosilane ($SiH_3Cl$, abbreviated as MCS) gas may also be used. As the source gas, an aminosilane-based source gas such as (ethylmethylamino)silane ($SiH_3[N(CH_3)(C_2H_5)]$) gas, (dimethylamino)silane ($SiH_3[N(CH_3)_2]$) gas, (diethyl-piperidino)silane ($SiH_3[NC_5H_3(C_2H_5)_2]$) gas, bis(diethylamino) silane ($SiH_2[N(C_2H_5)_2]_2$, abbreviated as BDEAS) gas, bis(tertiarybutylamino)silane ($SiH_2[NH(C_4H_9)]_2$, abbreviated as BTBAS) gas, bis(diethyl-piperidino)silane ($SiH_2[NC_5H_8(C_2H_5)]_2$, abbreviated as BDEPS) gas, tris(diethylamino)silane ($SiH[N(C_2H_5)_2]_3$, abbreviated as 3DEAS) gas, trisdimethylaminosilane ($Si[N(CH_3)_2]_3$, abbreviated as 3DMAS) gas, tetrakis(diethylamino)silane ($Si[N(C_2H_5)_2]_4$, abbreviated as 4DEAS) gas, and tetrakis(dimethylamino)silane ($Si[N(CH_3)_2]_4$, abbreviated as 4DMAS) gas may also be used. As the inert gas, instead of the $N_2$ gas, a rare gas such as Ar, He, Ne, and Xe may also be used.

[Step 2]

After the silicon-containing layer is formed, the valve 243a is closed to suspend supply of the HCDS gas. At this time, while the APC valve 244 is opened, the inside of the process chamber 201 is vacuum-exhausted by the vacuum pump 246, and an unreacted gas remaining in the process chamber 201 or HCDS gas that has contributed to formation of the silicon-containing layer is removed from the inside of the process chamber 201 (residual gas removal). Also, at this time, while the valves 243b, 243c, and 243g to 243i are opened, supply of the $N_2$ gas into the process chamber 201 continues. The $N_2$ gas serves as a purge gas and thereby it is possible to increase an effect of removing the unreacted gas remaining in the process chamber 201 or the HCDS gas that has contributed to formation of the silicon-containing layer from the inside of the process chamber 201.

Also, at this time, the gas remaining in the process chamber 201 may not be completely removed, and the inside of the process chamber 201 may not be completely purged. When an amount of the gas remaining in the process chamber 201 is small, there is no negative influence in step 3 performed thereafter. In this case, there is no need to set a flow rate of the $N_2$ gas supplied into the process chamber 201 to be high. For example, when the same amount of the $N_2$ gas as a volume of the process chamber 201 is supplied, it is possible to purge to the extent that there is no negative influence in step 3. When the inside of the process chamber 201 is not completely purged in this manner, a purge time decreases, thereby improving throughput. Also, it is possible to suppress unnecessary consumption of the $N_2$ gas to the minimum.

Similar to the temperature of the wafer 200 when the HCDS gas is supplied, the temperature of the heater 207 at this time is set to fall within, for example, a range of 350° C. to 800° C., preferably 450° C. to 800° C., and more preferably 550° C. to 750° C. The supply flow rate of the $N_2$ gas serving as a purge gas supplied from the inert gas supply system is set to a flow rate within, for example, a range of 100 sccm to 10,000 sccm. As the purge gas, instead of the N; gas, a rare gas such as Ar, He, Ne, and Xe may also be used.

[Step 3]

After the residual gas in the process chamber 201 is removed, the valves 243d and 243e are opened to flow the $O_2$ gas into the gas supply pipes 232d and 232e. The $O_2$ gas having a flow rate regulated by the MFCs 241d and 241e is supplied into the process chamber 201 in a heated and depressurized state from the gas supply holes 248d and 248e. At the same time, the valve 243f is opened to flow the $H_2$ gas into the gas supply pipe 232f. The $H_2$ gas having a flow rate regulated by the MFC 241f is supplied into the process chamber 201 in a heated and depressurized state from the gas supply hole 248a through the gas supply pipe 232a. The $O_2$ gas and the $H_2$ gas are mixed in the process chamber 201. The mixed gas flows into the exhaust space 205 through the exhaust hole 204c and is exhausted from the exhaust pipe 231 ($O_2$ gas+$H_2$ gas supply). At the same time, the valves 243g to 243i are opened to flow the $N_2$ gas into the gas supply pipes 232g to 232i. The $N_2$ gas having a flow rate regulated by the MFCs 241g to 241i is supplied into the process chamber 201 together with the $O_2$ gas and the $H_2$ gas and is exhausted from the exhaust pipe 231 through the exhaust hole 204c and the exhaust space 205.

Also, at this time, in order to prevent the $O_2$ gas, the $H_2$ gas, and the like from being introduced into the nozzles 233b and 233c, the valves 243b and 243c are opened to flow the $N_2$ gas into the gas supply pipes 232b and 232c. The $N_2$ gas is supplied into the process chamber 201 through the nozzles 233b and 233c and is exhausted from the exhaust pipe 231 through the exhaust hole 204c and the exhaust space 205.

At this time, by appropriately regulating the APC valve 244, the inside pressure of the process chamber 201 is maintained below atmospheric pressure, for example, in a range of 1 Pa to 1,330 Pa. The supply flow rate of the $O_2$ gas controlled by the MFCs 241d and 241e is set to a flow rate within, for example, a range of 400 sccm to 6,000 sccm, and for example, in a range of 1,000 sccm to 10,000 sccm in total. In other words, a ratio (flow rate balance) of the flow rate of the $O_2$ gas supplied from the nozzle 233d and the flow rate of the $O_2$ gas supplied from the nozzle 233e is set to, for example, a range of 4:6 to 6:4. The supply flow rate of the $H_2$ gas controlled by the MFC 241f is set to a flow rate within, for example, a range of 1,000 sccm to 10,000 sccm. The supply flow rate of the $N_2$ gas controlled by the MFCs 241b, 241c, and 241g to 241i is set to a flow rate within, for example, a range of 100 sccm to 10,000 sccm. A time for supplying the $O_2$ gas and the $H_2$ gas to the wafer 200, that is, a gas supply time (radiation time) is set to fall within, for example, a range of 1 to 120 seconds. Similar to the temperature range of the wafer 200 when the HCDS gas is supplied in step 1, the temperature of the heater 207 is set to be within the temperature range in which oxidizing power is significantly improved (this will be described later), for example, a range of 450° C. to 800° C., and preferably 550° C. to 750° C. When the temperature falls within this range, it was determined that oxidizing power (to be described later) significantly increases by adding the $H_2$ gas to the $O_2$ gas under a depressurized atmosphere. Also, when the temperature of the wafer 200 is excessively low, it was determined that it is difficult to increase the oxidizing power. In consideration of the throughput, it is preferable that the temperature of the heater 207 be set to maintain the temperature range in the process chamber 201 from steps 1 to 3 to the same temperature range. Also, it is preferable that the temperature of the heater 207 be set to maintain the temperature in the process chamber 201 from steps 1 to 4 (to be described later) to the same temperature range. In this case, the temperature of the heater 207 is set such that the temperature in the process chamber 201 is maintained constant to fall within, for example, a range of 450° C. to 800° C., and preferably 550° C. to 750° C., from steps 1 to 4 (to be described later).

Under the above conditions, when the $O_2$ gas and the $H_2$ gas are supplied into the process chamber 201, the $O_2$ gas and the $H_2$ gas are thermally activated (excited) as non-plasma and reacted under a heated and depressurized atmosphere. Accordingly, a water ($H_2O$)-free oxidizing species containing oxygen such as atomic oxygen (O) is generated. Then, the oxidation reaction is mainly performed on the silicon-containing layer formed on the wafer 200 in step 1 by this oxidizing species. Since energy of the oxidizing species is higher than bond energy of Si—N, Si—Cl, Si—H, and Si—C included in the silicon-containing layer, when the energy of the oxidizing species is applied to the silicon-containing layer, bonds of Si—N, Si—Cl, Si—H, and Si—C included in the silicon-containing layer are disconnected. N, H, Cl, and C, whose bonds with Si are disconnected, are removed from the film and discharged as $N_2$, $H_2$, $Cl_2$, HCl, $CO_2$, and the like. Also, when bonds with N, H, Cl, and C are disconnected, the remaining bonds of Si combine with O included in the oxidizing species and Si—O bonds are formed. In this way, the silicon-containing layer may be changed to a SiO layer having low content of impurities such as Cl (modified). According to the oxidation reaction, it is possible to significantly increase the oxidizing power compared to when only the $O_2$ gas is supplied or water vapor ($H_2O$) is supplied. That is, under a depressurized atmosphere, when the $H_2$ gas is added with the $O_2$ gas, it is possible to significantly increase the oxidizing power compared to when only the $O_2$ gas is supplied or the $H_2O$ gas is supplied.

As the oxygen-containing gas, instead of the $O_2$ gas, ozone ($O_3$) gas and the like may also be used. In the above temperature range, a test was performed to observe an effect of adding the hydrogen-containing gas to nitric oxide (NO) gas or nitrous oxide ($N_2O$) gas. The result showed that an effect of oxidizing power improvement is not obtained compared to when only the NO gas or the $N_2O$ gas is supplied. That is, as the oxygen-containing gas, a nitrogen-free oxygen-containing gas (a gas containing O without nitrogen) is preferably used. As the hydrogen-containing gas, instead of the $H_2$ gas, deuterium ($D_2$) gas and the like may also be used. In addition, when ammonia ($NH_3$) gas, methane ($CH_4$) gas, and the like are used, nitrogen (N) impurities or carbon (C) impurities may be mixed into the film. That is, as the hydrogen-containing gas, an other-element-free hydrogen-containing gas (a gas containing hydrogen or deuterium without any other elements) is preferably used. That is, as the oxygen-containing gas, at least one gas selected from the group consisting of the $O_2$ gas and $O_3$ gas may be used. As the hydrogen-containing gas, at least one gas selected from the group consisting of the $H_2$ gas and the $D_2$ gas may be used.

[Step 4]

After the silicon-containing layer is changed to the SiO layer, the valves 232d, 232e, and 232f are closed to suspend supply of the $O_2$ gas and the $H_2$ gas. At this time, while the APC valve 244 is opened, the inside of the process chamber 201 is vacuum-exhausted by the vacuum pump 246, and the $O_2$ gas or the $H_2$ gas remaining in the process chamber 201 and reaction by-products are removed from the inside of the process chamber 201 (residual gas removal). Also, while the valves 243b, 243c, and 243g to 243i are opened, supply of the $N_2$ gas into the process chamber 201 continues. The $N_2$ gas serves as a purge gas. Therefore, the unreacted gas remaining in the process chamber 201 or the $O_2$ gas or the $H_2$ gas that has contributed to formation of the SiO layer, and the reaction by-products may be further removed from the inside of the process chamber 201.

Also, at this time, the gas remaining in the process chamber 201 may not be completely removed, and the inside of the process chamber 201 may not be completely purged. When an amount of the gas remaining in the process chamber 201 is small, there is no negative influence in step 1 performed thereafter. In this case, there is no need to set a flow rate of the $N_2$ gas supplied into the process chamber 201 to be high. For example, when the same amount of the $N_2$ gas as a volume of the process chamber 201 is supplied, it is possible to purge to the extent that there is no negative influence in step 1. When the inside of the process chamber 201 is not completely purged in this manner, a purge time decreases, thereby improving throughput. Also, it is possible to suppress unnecessary consumption of the $N_2$ gas to the minimum.

Similar to the temperature of the wafer 200 when the $O_2$ gas and the $H_2$ gas are supplied, the temperature of the heater 207 at this time is set to fall within, for example, a range of 450° C. to 800° C., and preferably 550° C. to 750° C. The supply flow rate of the $N_2$ gas serving as a purge gas supplied from each inert gas supply system is set to a flow rate within, for example, a range of 100 sccm to 10,000 sccm. As the purge gas, instead of the $N_2$ gas, a rare gas such as Ar, He, Ne, and Xe may also be used.

(Performing Predetermined Number of Times)

When a cycle including steps 1 to 4 is performed a predetermined number of times, and preferably a plurality of times (n times), it is possible to form the SiO film having a predetermined film thickness on the wafer 200.

Also, when the cycle is performed the plurality of times, if it is described that "a predetermined gas is supplied to the wafer 200" in each step after at least a second cycle, it means that "a predetermined gas is supplied to the layer formed on the wafer 200, that is, to the outermost surface of the wafer 200 as the laminate." When it is described that "a predetermined layer is formed on the wafer 200," it means that "a predetermined layer is formed on the layer formed on the wafer 200, that is, on the outermost surface of the wafer 200 as the laminate." These are the same as the above description and will be the same in other embodiments to be described later.

(Purging and Restoring to Atmospheric Pressure)

When the SiO film having a predetermined film thickness is formed, the valves 243b. 243c, and 243g to 243i are opened, and the $N_2$ gas is supplied from the gas supply pipes 232b, 232c, and 232g to 232i into the process chamber 201 and is exhausted from the exhaust pipe 231 through the exhaust hole 204c and the exhaust space 205. The $N_2$ gas serves as a purge gas. Therefore, the inside of the process chamber 201 is purged with the inert gas, and the gas remaining in the process chamber 201 is removed from the inside of the process chamber 201 (purge). Then, the atmosphere in the process chamber 201 is replaced with the inert gas, and the inside pressure of the process chamber 201 is restored to the normal pressure (restoration to atmospheric pressure).

(Boat Unloading and Wafer Discharge)

Then, the seal cap 219 is lowered by the boat elevator 115, and thereby the lower end of the manifold 209 is opened, and the plurality of processed wafers 200 are unloaded (boat unloading) to the outside of the process chamber 201 from the lower end of the manifold 209 while being held on the boat 217. Then, the plurality of processed wafers 200 are extracted from the boat 217 (wafer discharge).

(3) Advantageous Effects

According to this embodiment, one or a plurality of effects to be described will be obtained.

(a) According to this embodiment, in step 3, the $H_2$ gas is supplied into the process chamber 201 using the nozzle 233a (first nozzle) including at least the plurality of gas supply holes 248a that are provided from the top to the bottom so as to correspond to a substrate arrangement region in which the plurality of wafers 200 are arranged. Also, at this time, the $O_2$ gas is supplied into the process chamber 201 using the nozzles 233d and 233e (second nozzle) including at least one of the gas supply holes 248d and 248e that is provided at only the top and the bottom so as to correspond to only the wafers 200 arranged at the top and the bottom out of the plurality of wafers 200. Accordingly, it is possible to uniformize a concentration distribution of an oxidizing species (atomic oxygen) generated by reacting the $O_2$ gas and the $H_2$ gas in an entire wafer arrangement region, in particular, in a wafer arrangement direction. As a result, it is possible to improve inter-plane uniformity and in-plane uniformity of the film thickness of the SiO film formed on the plurality of wafers 200. Also, since there is no need to reduce the number of batch-processed wafers 200, it is possible to prevent productivity decrease of substrate processing.

Also, as in this embodiment, in step 3, the $H_2$ gas is supplied into the process chamber 201 using the nozzle 233a including at least the same number of gas supply holes 248a as the plurality of wafers 200 that are provided from the top to the bottom so as to correspond one-to-one to the plurality of wafers 200. Also, at this time, by supplying the $O_2$ gas into the process chamber 201 using the nozzles 233d and 233e including at least one of the gas supply holes 248d and 248e that are provided at only the top and the bottom so as to correspond one-to-one to the wafers 200 arranged at the top and the bottom out of the plurality of wafers 200, it is easy to obtain the above effects.

Here, for reference, a case of forming a SiO film using a conventional substrate processing apparatus will be described with reference to FIG. 6.

A vertical processing furnace of the conventional substrate processing apparatus illustrated in FIG. 6 includes a process chamber configured to accommodate a plurality of wafers arranged in a vertical direction in a horizontal posture, a nozzle configured to supply the HCDS gas and the $H_2$ gas into the process chamber, and a nozzle configured to supply $O_2$ gas into the process chamber. These two nozzles are provided at positions separated by a predetermined distance, so as to extend along a stacking direction of the wafers are arranged, along an outer circumference of the wafer. In addition, at sides of these two nozzles, at least the same number of gas supply holes as the plurality of wafers are provided so as to correspond one-to-one to the plurality of wafers accommodated in the process chamber. The plurality of wafers arranged at intervals in a vertical direction in a horizontal posture are accommodated in the process chamber. Then, a process of supplying the HCDS gas into the process chamber, and a process of supplying the $O_2$ gas and the $H_2$ gas into the process chamber 200 under heated atmosphere having a pressure lower than an atmospheric pressure are alternately performed a predetermined number of times, with a purge process of removing a residual gas in the process chamber interposed therebetween. Thereby, the SiO film may be formed on the wafer.

An in-plane film thickness distribution of the SiO film formed using the vertical processing furnace illustrated in FIG. 6 was examined. The result showed that a film thickness of the SiO film decreases in the vicinity of the center of the wafer and increases in the vicinity of the outer circumference. That is, it was found that the in-plane film thickness distribution has a conical shape (concave). This phenomenon is called a loading effect in a plane within the wafer (loading effect) (hereinafter simply referred to as an in-plane LE). As a cause of the in-plane LE, a case in which a processing gas such as the HCDS gas, the $O_2$ gas, and the $H_2$ gas is consumed in the vicinity of the outer circumference of the wafer and is not sufficiently supplied in the vicinity of the center of the wafer, that is, insufficient supply of the processing gas, may be exemplified. Also, insufficient removal (insufficient purge) of the residual gas in the above purge process may be exemplified as one of the factors. When the residual gas is insufficiently removed, a plurality of different processing gases are mixed in the process chamber, which causes a gas phase reaction. As a result, the film thickness of the SiO film may increase in the vicinity of the outer circumference of the wafer.

Figure 7:
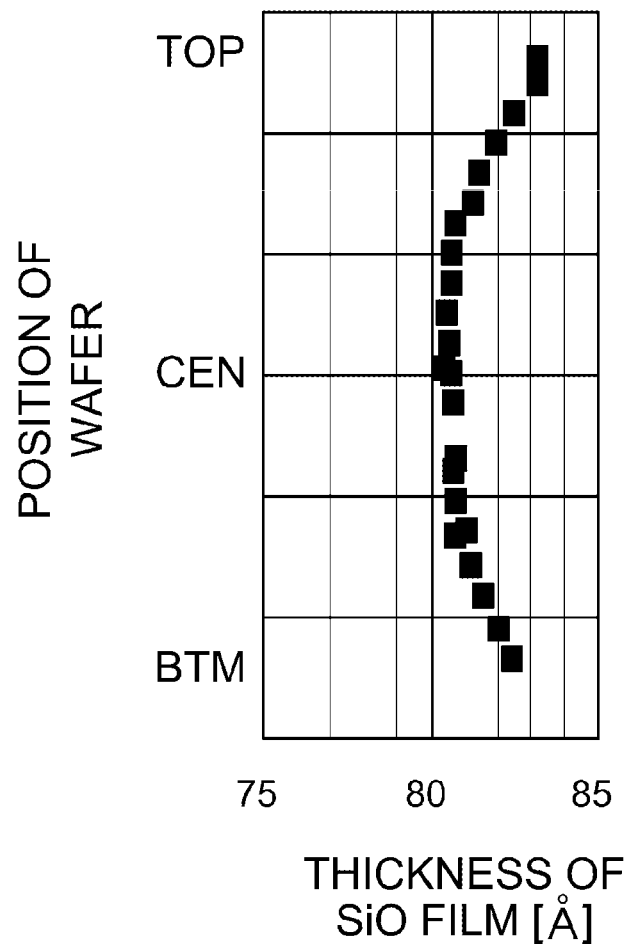
FIG. 7 is a diagram illustrating inter-plane film thickness uniformity of a silicon oxide film (SiO film) formed using the conventional substrate processing apparatus.

An inter-plane film thickness distribution of the SiO film formed using the vertical processing furnace illustrated in FIG. 6 was examined. As illustrated in FIG. 7, the result showed that the film thickness of the SiO film decreases at the center of the wafer arrangement region and increases at the bottom and the top of the wafer arrangement region. That is, it was found that the inter-plane film thickness distribution has an arch shape in the direction in which the wafers are arranged. In FIG. 7, a horizontal axis of represents an in-plane average film thickness (Å) of the SiO film formed on the wafer and a vertical axis represents a position of the wafer in the process chamber (in the wafer arrangement region). As illustrated in FIG. 7, it may be understood that the in-plane average film thickness of the SiO film formed on the wafer is thin at the center (CEN) of the wafer arrangement region at 80 Å, and is thick at the bottom (BTM) and the top (TOP) of the wafer arrangement region at 82 Å to 84 Å. This phenomenon is called a loading effect between planes of the wafer (hereinafter simply referred to as an inter-plane LE).

Factors causing the inter-plane LE are more complicated than the factors causing the in-plane LE. For example, when the SiO film is formed on a plurality of single crystal Si wafers (hereinafter referred to as a bare wafer) using the vertical processing furnace illustrated in FIG. 6, the in-plane LE may be improved by increasing the flow rate of the HCDS gas or increasing the flow rate of the $O_2$ gas and the $H_2$ gas, but the inter-plane LE may not be sufficiently improved. Therefore, other than insufficient supply of the processing gas and insufficient purge in the purge process causing the in-plane LE, the inter-plane LE is caused by other factors and these several factors are considered to have a complex relationship. As other factors causing the inter-plane LE, the inventors have intensively studied, for example, reaction delay of the $O_2$ gas and the $H_2$ gas, that is, a distance (time) in which the $O_2$ gas and the $H_2$ gas react in the process chamber to generate the oxidizing species (atomic oxygen), a pressure difference in the process chamber, a surface to be processed of the wafer, that is, a state of a base of the deposition, and the like.

Figure 8:
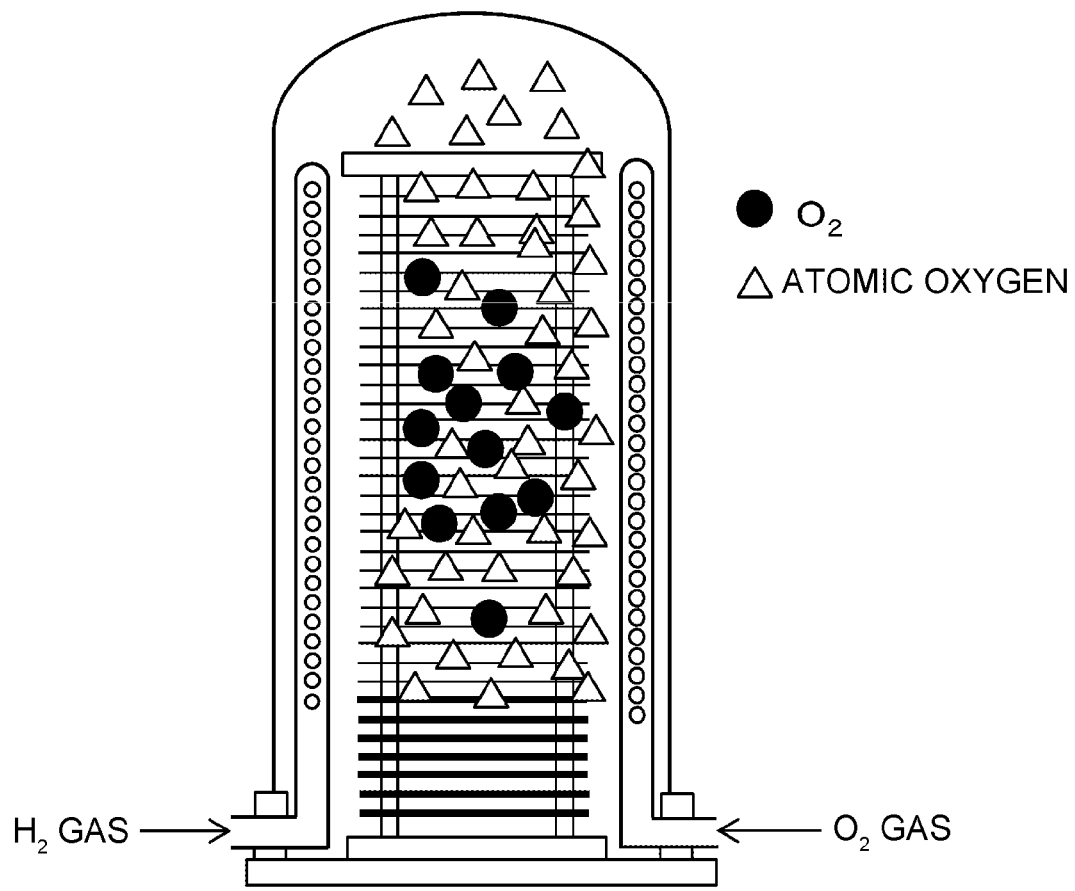
FIG. 8 is a diagram illustrating a distribution of atomic oxygen in the vertical processing furnace of the conventional substrate processing apparatus.

FIG. 9 is a diagram illustrating an analysis model for analyzing reaction delay of the $O_2$ gas and the $H_2$ gas, that is, the distance (time) from supply of the $O_2$ gas and the $H_2$ gas into the process chamber of the vertical processing furnace exemplified in FIG. 6 to generation of the oxidizing species (atomic oxygen) by reacting these gases in the process chamber, and an analysis result thereof. As illustrated in FIG. 9, when the temperature in the process chamber is set to, for example, 600° C., it may be understood that a predetermined distance (time) is necessary from reacting the $O_2$ gas and the $H_2$ to generating the atomic oxygen. FIG. 8 is a diagram schematically illustrating a concentration distribution of the atomic oxygen in the process chamber obtained from the analysis result. In FIG. 8, ● denotes a molecule of unreacted $O_2$ gas, and A denotes the atomic oxygen generated by reacting the $O_2$ gas and the $H_2$ gas. As illustrated in FIG. 8, it may be understood that the concentration of the atomic oxygen in the process chamber decreases (is low) at the center of the wafer arrangement region and increases (is high) at the bottom and the top of the wafer arrangement region. It may also be understood that a great amount of the unreacted $O_2$ gas remains at the center of the wafer arrangement region. In addition, the concentration distribution of the atomic oxygen illustrated in FIG. 8 matches the inter-plane film thickness distribution of the SiO film illustrated in FIG. 7. That is, the film thickness of the SiO film decreases at the center of the wafer arrangement region having a low concentration of the atomic oxygen, and the film thickness of the SiO film increases at the bottom and the top of the wafer arrangement region having a high concentration of the atomic oxygen. In other words, it may be understood that the reaction delay of the $O_2$ gas and the $H_2$ gas is one of main factors causing the inter-plane LE.

In this embodiment, when the $O_2$ gas is supplied into the process chamber using the nozzles 233d and 233e including the gas supply holes 248d and 248e that are provided at only the top and the bottom so as to correspond to only the wafers 200 arranged at the top and the bottom out of the plurality of wafers 200, it is possible to appropriately regulate the reaction delay of the $O_2$ gas and the $H_2$ gas. That is, it is possible to appropriately regulate the distance (time) from supply of the $O_2$ gas and the $H_2$ gas into the process chamber 201 to generation of the atomic oxygen by reacting these gases. Also, when the $O_2$ gas is supplied using the nozzles 233d and 233e including the gas supply holes 248d and 248e that are provided at only the top and the bottom, it is possible to increase an exhaust path of the $O_2$ gas in the process chamber 201, that is, a path from supply of the $O_2$ gas into the process chamber 201 to exhaust thereof. Accordingly, it is possible to increase a distance (time) in which the $O_2$ gas and the $H_2$ gas remain in a mixed state in the process chamber 201, that is, a distance (time) in which these gases flow in a mixed state. As a result, it is possible to uniformize the concentration of the atomic oxygen in the process chamber in an entire wafer arrangement region, in particular, in a wafer arrangement direction. Therefore, it is possible to obtain the effects described above.

Also, even in the conventional substrate processing apparatus exemplified in FIG. 6, by reducing the number of batch-processed wafers to, for example, 125 to 50, it is possible to suppress occurrence of the in-plane LE or the inter-plane LE. However, in this case, productivity of substrate processing decreases. According to this embodiment, since there is no need to reduce the number of batch-processed wafers, it is possible to prevent productivity decrease of substrate processing.

(b) In this embodiment, the nozzles 233d and 233e (second nozzle) configured to supply the $O_2$ gas are provided at positions separated by a predetermined distance from the nozzle 233a (first nozzle) configured to supply the $H_2$ gas in the circumferential direction of the wafer 200. That is, the nozzle 233a configured to supply the $H_2$ gas is provided at a position facing the exhaust hole 204c with respect to the center of the wafer 200 accommodated in the inner tube 204, and the nozzles 233d and 233e configured to supply the $O_2$ gas are provided at positions that do not face the exhaust hole 204c with respect to the center of the wafer 200 accommodated in the inner tube 204. Accordingly, it is possible to appropriately regulate the distance (time) from supply of the $O_2$ gas and the $H_2$ gas into the process chamber 201 to generation of the atomic oxygen by reacting these gases. In addition, it is possible to increase the distance (time) in which the $O_2$ gas and the $H_2$ gas are supplied into the process chamber 201 and then these gases flow in a mixed state. As a result, it is possible to uniformize the concentration distribution of the atomic oxygen in the process chamber 201 and it is possible to improve the inter-plane uniformity and the in-plane uniformity of the film thickness of the SiO film.

(c) In this embodiment, the second nozzle configured to supply the $O_2$ gas is configured as two, the nozzles 233d and 233e. Then, the MFC is provided in each of the gas supply pipes 232d and 232e connected to the nozzles 233d and 233e. In this way, it is possible to independently control the flow rate of the O₂ gas supplied from the nozzle 233d and the flow rate of the O₂ gas supplied from the nozzle 233e. In other words, it is possible to freely regulate a ratio (flow rate balance) of the flow rate of the oxygen-containing gas supplied from the nozzle 233d and the flow rate of the oxygen-containing gas supplied from the nozzle 233e. As a result, it is possible to uniformize the concentration distribution of the atomic oxygen in the process chamber 201 more accurately, and it is possible to further improve the inter-plane uniformity and the in-plane uniformity of the film thickness of the SiO film.

(d) In this embodiment, when the HCDS gas is supplied from the nozzle 233a, the N₂ gas is supplied from each of the nozzles 233b and 233c that are provided to surround the nozzle 233a on both sides, along the outer circumference of the wafer 200. As a result, it is possible to control the flow path of the HCDS gas and the like in the process chamber 201 and it is possible to improve the in-plane uniformity of the film thickness of the SiO film.

(e) In this embodiment, supply of the HCDS gas and supply of the H₂ gas are performed together using the nozzle 233a. That is, the nozzle configured to supply the HCDS gas and the nozzle configured to supply the H₂ gas are shared. As a result, it is possible to simplify a configuration of the substrate processing apparatus, thereby reducing a manufacturing cost or a maintenance cost thereof.

(f) According to this embodiment, by alternately performing a process of supplying the HCDS gas into the process chamber 201 accommodating the wafer 200 and forming the silicon-containing layer on the wafer 200, and a process of supplying the O₂ gas and the H₂ gas into the process chamber 201 200 under heated atmosphere having a pressure lower than an atmospheric pressure and changing the silicon-containing layer to the SiO layer, a predetermined number of times, the SiO film is formed on the wafer 200. Therefore, it is possible to further improve the in-plane film thickness uniformity of the SiO film formed on the wafer 200 and step coverage compared to when the SiO film is formed by a general CVD method.

(g) According to this embodiment, in the process of changing the silicon-containing layer to the SiO layer, the O₂ gas and the H₂ gas react in the process chamber 201 200 under heated atmosphere having a pressure lower than an atmospheric pressure to generate a water-free oxidizing species containing oxygen such as atomic oxygen, and the silicon-containing layer is changed to the SiO layer using this oxidizing species. As a result, it is possible to form an extremely high quality SiO film having very small content of impurities such as Cl.

Other Embodiment of the Present Invention

While the embodiment of the present invention has been specifically described above, the present invention is not limited to the above embodiment but it may be variously modified without departing from the scope of the invention.

For example, in the embodiment described above, while the example in which each of the gas supply holes 248d and 248e is opened to the center of the process chamber 201 and the O₂ gas is supplied toward the center of the wafer 200 has been described, the present invention is not limited thereto. For example, each of the gas supply holes 248d and 248e may be configured to supply the O₂ gas downstream from the center of the wafer 200 with respect to a flow of the H₂ gas, that is, on the gas exhaust hole side. Also, for example, each of the gas supply holes 248d and 248e may be configured to supply the O₂ gas upstream from the center of the wafer 200 with respect to a flow of the H₂ gas, that is, on the gas supply hole side. In such a configuration, it is possible to increase or decrease the distance (time) in which the O₂ gas supplied from the gas supply holes 248d and 248e and the H₂ gas supplied from the gas supply hole 248a are mixed, or the distance (time) in which the gases flow in a mixed state. As a result, it is possible to appropriately regulate the concentration distribution of the atomic oxygen in the process chamber 201, in particular, the concentration distribution in the wafer arrangement direction.

Also, in the embodiment described above, while the example in which a plurality of each of the gas supply holes 248d and 248e are provided, and the gas supply holes 248d and 248e have the same area and pitch has been described, the present invention is not limited thereto.

For example, when the plurality of gas supply holes 248d are provided, the areas of the gas supply holes 248d may be gradually reduced from an upper end to a lower part of the nozzle 233d, as illustrated in FIG. 4B. Also, when the plurality of gas supply holes 248e are provided, the areas of the gas supply holes 248e may be gradually reduced from a lower end to an upper part of the nozzle 233e.

In addition, for example, when the plurality of gas supply holes 248d are provided, the pitch between the gas supply holes 248d may be gradually increased from an upper end to a lower part of the nozzle 233d, as illustrated in FIG. 4C. Also, when the plurality of gas supply holes 248e are provided, the pitch between the gas supply holes 248e may be gradually increased from a lower end to an upper part of the nozzle 233e.

In such a configuration, it is possible to regulate the concentration distribution of the atomic oxygen in the process chamber 201, in particular, the concentration distribution in the wafer arrangement direction, more smoothly (continuously without steps).

Also, in the embodiment described above, while the example in which the second nozzle configured to supply the oxygen-containing gas includes two nozzles, the nozzle 233d serving as an upper opening nozzle and the nozzle 233e serving as a lower opening nozzle, has been described, the present invention is not limited thereto. For example, as illustrated in FIG. 4D, the second nozzle may be configured as a single nozzle 233d' including at least one gas supply hole 248d' that is provided at only the top and the bottom. In such a configuration, it is possible to simplify the configuration of the substrate processing apparatus, thereby reducing a manufacturing cost or a maintenance cost thereof. Also, in FIG. 4D, an example in which the area of the gas supply hole 248d' at the top gradually decreases from an upper end to a lower part of the nozzle 233d', and the area of the gas supply hole 248d' at the bottom gradually decreases from a lower end to an upper part of the nozzle 233d' is provided.

Also, in the embodiment described above, while the example in which a length of the nozzle 233d serving as an upper opening nozzle and a length of the nozzle 233e serving as a lower opening nozzle are the same has been described, the present invention is not limited thereto. For example, the length of the nozzle 233e serving as a lower opening nozzle may be smaller than the length of the nozzle 233d serving as an upper opening nozzle, as illustrated in FIG. 4E. In such a configuration, it is possible to reduce a manufacturing cost of the nozzle, that is, a manufacturing cost of the substrate processing apparatus. However, in this case, since there may be a difference in a volume of a space in which the gas flows, between a part having the nozzle 233e and an upper part of the nozzle 233e having no nozzle 233e, more gas may be introduced into an upper space of the nozzle 233e. In this regard, as exemplified in FIGS. 4A through 4C, it is preferable that the length of the nozzle 233d serving as an upper opening nozzle and the length of the nozzle 233e serving as a lower opening nozzle be the same. In such a configuration, since the volume of the space in which the gas flows may be uniformized in a direction in which the wafers 200 are arranged, it is possible to further improve the inter-plane uniformity of substrate processing.

Also, in the embodiment described above, while the example in which at least the same number of gas supply holes 248a through 248c as the plurality of wafers 200 are provided so as to correspond one-to-one (respectively) to the plurality of wafers 200 accommodated in the process chamber 201 has been described, the present invention is not limited thereto. For example, one each of the gas supply holes 248a through 248c may be provided to correspond to several of the wafers 200 out of the plurality of wafers 200 accommodated in the process chamber 201, for example, one for every two wafers 200. In addition, for example, several each of the gas supply holes 248a through 248c may be provided to correspond one-to-one to the plurality of wafers 200, for example, two each for a single wafer 200.

Also, in the embodiment described above, while the example in which at least the same number of gas supply holes 248d and 248e as the plurality of wafers 200 arranged at the top or the bottom are provided so as to correspond one-to-one to the plurality of wafers 200 arranged at the top or the bottom in the process chamber 201 has been described, the present invention is not limited thereto. For example, one each of the gas supply holes 248d and 248e may be provided to correspond to several of the wafers 200 out of the plurality of wafers 200 accommodated at the top or the bottom in the process chamber 201, for example, one for every two wafers 200. In addition, for example, several each of the gas supply holes 248d and 248e may be provided to correspond one-to-one to the plurality of wafers 200 accommodated in the top or the bottom in the process chamber 201, for example, two each.

Also, in the embodiment described above, while the example in which supply of the HCDS gas and supply of the $H_2$ gas are performed using the nozzle 233a has been described, the present invention is not limited thereto. For example, supply of the HCDS gas may be performed using the nozzle 233a and supply of the $H_2$ gas may be performed using either or both of the nozzles 233b and 233c.

Also, in the embodiment described above, while the example in which supply of the HCDS gas is performed using the nozzle 233a has been described, the present invention is not limited thereto. For example, supply of the HCDS gas may be performed using any of the nozzles 233b and 233c without using the nozzle 233a.

Also, in the embodiment described above, while the example in which supply of the $O_2$ gas is performed using only the nozzles 233d and 233e has been described, the present invention is not limited thereto. For example, while supply of the $O_2$ gas is performed using the nozzles 233d and 233e, any of the nozzles 233a through 233c may be further used to supply the $O_2$ gas. For example, supply of the HCDS gas and the $H_2$ gas may be performed using the nozzle 233c and supply of the $O_2$ gas may be performed using the nozzles 233b, 233d, and 233e.

That is, supply of the HCDS gas may be performed using any of the nozzles 233a through 233c. In addition, supply of the $H_2$ gas may be performed using any of the nozzles 233a through 233c. In addition, supply of the $O_2$ gas may be performed using the nozzles 233d and 233e or using any of the nozzles 233d and 233e and the nozzles 233a through 233c. In addition, the nozzle configured to supply the HCDS gas and the nozzle configured to supply the $H_2$ gas may be shared. Also, the nozzle configured to supply the $O_2$ gas and the nozzle configured to supply the $H_2$ gas may be shared. When the nozzle is shared by a plurality of types of gases, it is possible to simplify the configuration of the substrate processing apparatus, thereby reducing a manufacturing cost or a maintenance cost. However, under the above temperature conditions, since it is considered that the HCDS gas and the $H_2$ gas do not react, but the HCDS gas and the $O_2$ gas react, the nozzle configured to supply the HCDS gas and the nozzle configured to supply the $O_2$ gas may be separately provided.

Also, in the embodiment described above, while the example in which, when the HCDS gas is supplied from the nozzle 233a, the $N_2$ gas is supplied from each of the nozzles 233b and 233c provided to surround the nozzle 233a on the both sides, along the outer circumference of the wafer 200 and thereby the flow path of the HCDS gas and the like is controlled has been described, the present invention is not limited thereto. For example, when the HCDS gas is supplied from the nozzle 233a, the $N_2$ gas is supplied from any of the nozzles 233b and 233c, and thereby the flow path of the HCDS gas and the like may be controlled. In addition, when the HCDS gas is supplied from the nozzle 233a, the present invention may be preferably applied when the $N_2$ gas is not supplied from the nozzles 233b and 233c or the nozzles 233b and 233c and the flow path control gas supply system connected to these nozzles is not provided.

Also, in the embodiment described above, while the film-forming sequence of forming (depositing) the SiO film on the plurality of wafers 200 by alternately performing a process of supplying the HCDS gas into the process chamber 201 accommodating the plurality of wafers 200 and a process of supplying the $H_2$ gas and the $O_2$ gas into the process chamber 201 under heated atmosphere having a pressure lower than an atmospheric pressure, a predetermined number of times (at least once), has been described, the present invention is not limited thereto. For example, as the gas supply timing illustrated in FIG. 5B, the present invention may be preferably applied to a film-forming sequence in which these processes are simultaneously performed a predetermined number of times (at least once) to form (deposit) the SiO film on the plurality of wafers 200. In addition, for example, as the gas supply timing illustrated in FIG. 5C, the present invention may be preferably applied to a film-forming sequence in which the $H_2$ gas and the $O_2$ gas are supplied into the process chamber 201 accommodating the plurality of wafers 200 under heated atmosphere having a pressure lower than an atmospheric pressure, and each surface of the plurality of wafers 200 is oxidized to form the SiO film. For example, the processing conditions herein may be the same as the processing conditions in the above embodiment.

Also, in the embodiment described above, while the example in which supply of the $H_2$ gas and supply of the $O_2$ gas into the process chamber 201 start at the same time, and then supply of the $H_2$ gas and supply of the $O_2$ gas into the process chamber 201 stop at the same time has been described, the present invention is not limited thereto. For example, as the gas supply sequence (timing) illustrated in FIG. 13A, supply of the $H_2$ gas into the process chamber 201 may start earlier than supply of the $O_2$ gas or supply of the $H_2$ gas into the process chamber 201 may be stopped later than supply of the O₂ gas. That is, in step 3, supply stop of the H₂ gas may precede and supply stop of the O₂ gas may precede. Also, for example, as the gas supply sequence illustrated in FIG. 13B, the flow rate of the H₂ gas supplied into the process chamber 201 may be set to be higher than the flow rate of the O₂ gas supplied into the process chamber 201. That is, in step 3, supply conditions of the O₂ gas and the H₂ gas may be set as hydrogen-rich conditions. In addition, as the gas supply sequence illustrated in FIG. 13C, the gas supply sequences illustrated in FIGS. 13A and 13B may be combined.

According to the gas supply sequences illustrated in FIGS. 13A through 13C, it is possible to form the SiO film without oxidizing a base of the deposition. This is particularly effective when the base of the deposition is a metal (a metal film). When the atomic oxygen generated by reacting the O₂ gas and the H₂ gas is used, since oxidizing power of the atomic oxygen is strong, the base of the deposition may be oxidized during film formation. On the other hand, as illustrated in FIGS. 13A through 13C, in step 3, by starting supply of the H₂ gas first, stopping supply of the O₂ gas first, setting gas supply conditions as the hydrogen-rich conditions, or combining these methods, it is possible to perform oxidization using the atomic oxygen under a reducing (H₇) atmosphere, thereby suppressing oxidization of the base of the deposition. In the gas supply sequences illustrated in FIGS. 13A through 13C, it is possible to obtain the effects as in the above embodiment.

Also, in the embodiment described above, while the example in which the HCDS gas, the O₂ gas, and the H₂ gas are used to form the SiO film on the wafer 200 has been described, the present invention is not limited thereto.

For example, as the gas supply sequence illustrated in FIG. 14A, a silicon oxynitride film (SiON film) may be formed on the wafer 200 by performing a cycle a predetermined number of times. The cycle includes supply of the HCDS gas into the process chamber 201 accommodating the plurality of wafers 200, supply of ammonia (NHS) gas serving as a nitriding gas into the process chamber 201, and supply of the O₂ gas and the H₂ gas into the process chamber 201 under heated atmosphere having a pressure lower than an atmospheric pressure. Also, in the gas supply sequence illustrated in FIG. 14A, the O₂ gas may not be supplied into the process chamber 201. In this case, a silicon nitride film (SiN film) is formed on the wafer 200.

Figure 14B:
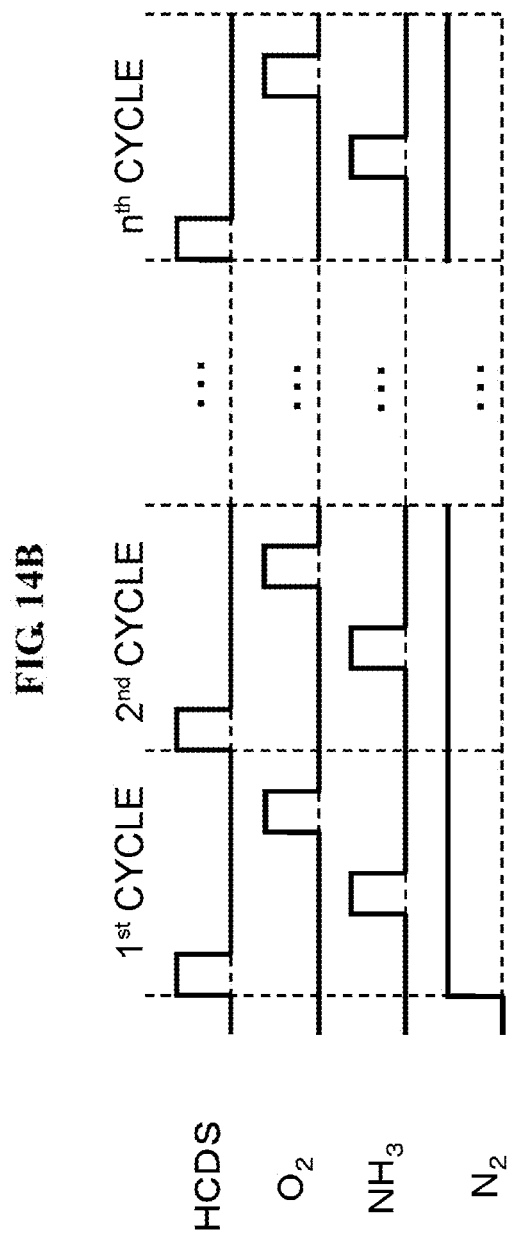

In addition, for example, as the gas supply sequence illustrated in FIG. 14B, the SiON film may be formed on the wafer 200 by performing a cycle a predetermined number of times. The cycle includes supply of the HCDS gas into the process chamber 201 accommodating the plurality of wafers 200, supply of NH₃ gas into the process chamber 201, and supply of the O₂ gas into the process chamber 201. Also, in the gas supply sequence illustrated in FIG. 14B, the O₂ gas may not be supplied into the process chamber 201. In this case, the SiN film is formed on the wafer 200.

Figure 14C:
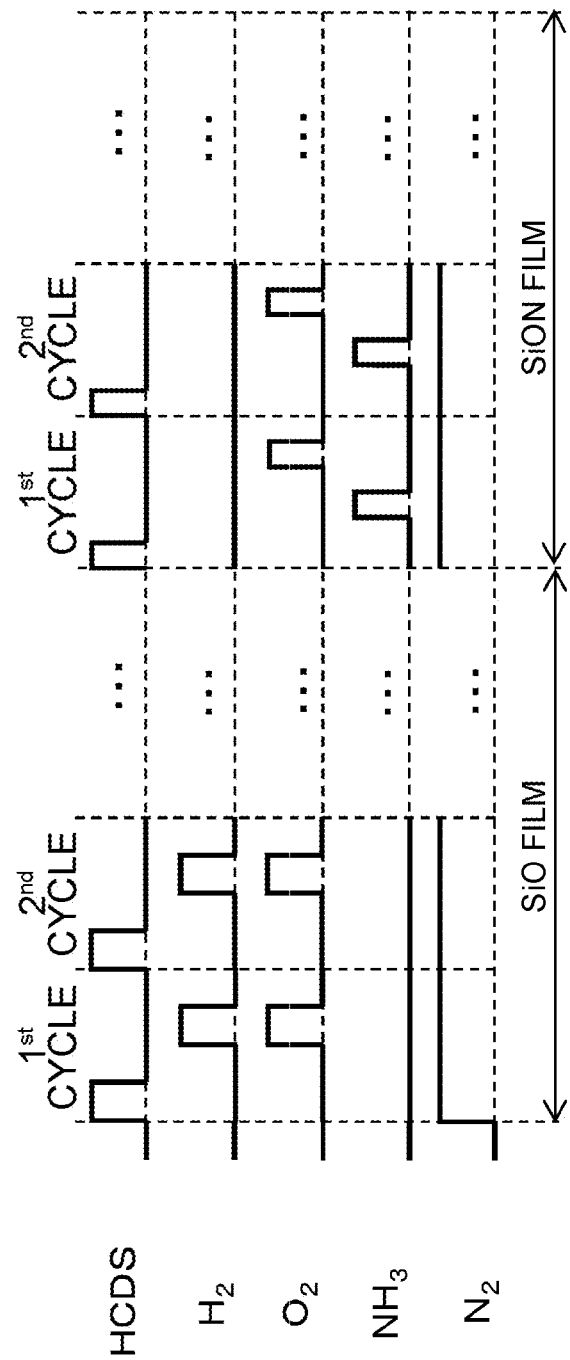

Also, for example, as the gas supply sequence illustrated in FIG. 14C, after the SiO film is formed by the gas supply sequence illustrated in FIG. 5A, the SiON film is formed by the gas supply sequence illustrated in FIG. 14B, and a laminated film in which the SiO film and the SiON film are laminated may be formed on the wafer 200 in-situ. In addition, after the SiON film is formed, the SiO film is formed, and a laminated film in which the SiON film and the SiO film are laminated may be formed on the wafer 200 in-situ. In addition, by alternately performing formation of the SiO film and formation of the SiON film a predetermined number of times, a laminated film in which the SiO film and the SiON film are alternately laminated may be formed on the wafer 200 in-situ.

In addition, as the gas supply sequence illustrated in FIG. 14D, after the SiO film is formed by the gas supply sequence illustrated in FIG. 5A, the SiON film is formed by the gas supply sequence illustrated in FIG. 14B, and then the SiN film is formed by performing a cycle a predetermined number of times, the cycle including supply of the HCDS gas into the process chamber 201 and supply of the NH₃ gas into the process chamber 201. Then, a laminated film in which the SiO film, the SiON film, and the SiN film are laminated may be formed on the wafer 200 in-situ. In addition, an order of forming the SiO film, the SiON film, and the SiN film may be arbitrarily changed. For example, after the SiO film is formed, the SiN film and the SiON film are sequentially formed, and a laminated film in which the SiO film, the SiN film, and the SiON film are laminated may be formed on the wafer 200 in-situ. Also, for example, after the SiON film is formed, the SiO film and the SiN film are sequentially formed or the SiN film and the SiO film are sequentially formed, and a laminated film in which the SiON film, the SiO film, and the SiN film are laminated or a laminated film in which the SiON film, the SiN film, and the SiO film are laminated may be formed on the wafer 200 in-situ. Also, for example, after the SiN film is formed, the SiON film and the SiO film are sequentially formed or the SiO film and the SiON film are sequentially formed, and a laminated film in which the SiN film, the SiON film, and the SiO film are laminated or a laminated film in which the SiN film, the SiO film, and the SiON film are laminated may be formed on the wafer 200 in-situ. In addition, by performing a cycle including formation of the SiO film, formation of the SiON film, and formation of the SiN film a predetermined number of times, a laminated film in which the SiO film, the SiON film, and the SiN film are laminated in any order may be formed on the wafer 200 in-situ.

Also, in this case, the NH₃ gas may be supplied from any of the gas supply pipes 233a through 233c. In this case, the nozzle configured to supply the NH; gas and the nozzle configured to supply the H₂ gas may be shared. By reducing the number of nozzles, it is possible to reduce a manufacturing cost or a maintenance cost of the substrate processing apparatus. However, under the above temperature conditions, since it is considered that the HCDS gas and the NH; gas react, the nozzle configured to supply the HCDS gas and the nozzle configured to supply the NH₃ gas may be separately provided. For example, the NH₃ gas may be supplied into the process chamber 201 through the gas supply pipe 232b, the MFC 241b, the valve 243b, and the nozzle 233b. In this case, the gas supply pipe 232b, the MFC 241b, and the valve 243b constitute a nitriding gas (nitrogen-containing gas) supply system. The nozzle 233b may be further included in the nitriding gas supply system.

Also, in the embodiment described above, in step 3, while the example in which, while the H₂ gas is supplied into the process chamber 201, that is, during a period of supplying the H₂ gas, the O₂ gas is continuously supplied into the process chamber 201 has been described, the present invention is not limited thereto. For example, in step 3, while the H₂ gas is supplied into the process chamber 201, supply of the O₂ gas into the process chamber 201 may be intermittently performed a plurality of times. In addition, in step 3, while the H₂ gas is supplied into the process chamber 201, supply of the O₂ gas into the process chamber 201 using the nozzle 233d and supply of the O₂ gas into the process chamber 201 using the nozzle 233e may be alternately performed a plurality of times.

Also, in the embodiment described above, while the example in which a semiconductor-based thin film containing the semiconductor element Si is formed as a thin film has been described, the present invention is not limited thereto. That is, the present invention may be preferably applied when a metal-based thin film containing a metal element such as titanium (Ti), zirconium (Zr), hafnium (Hf), tantalum (Ta), aluminum (Al), and molybdenum (Mo) is formed as a thin film.

For example, as a metal-based thin film containing Ti, when a titanium oxide film (TiO film) is formed, as a source gas, for example, a gas which contains Ti and a chloro group such as titanium tetrachloride ($TiCl_4$), a gas which contains Ti and a fluoro group such as titanium tetrafluoride ($TiF_4$), or a gas which contains Ti and an amino group such as tetrakis(ethylmethylamino)titanium ($Ti[N(C_2H_5)(CH_3)]_4$, abbreviated as TEMAT) may be used. As the oxygen-containing gas and the hydrogen-containing gas, the same gases as in the above embodiment may be used. Also, processing conditions may be the same, for example, as in the above embodiment.

Also, as a metal-based thin film containing Zr, when a zirconium oxide film (ZrO film) is formed, as a source gas, for example, a gas which contains Zr and a chloro group such as zirconium tetrachloride ($ZrCl_4$), a gas which contains Zr and a fluoro group such as zirconium tetrafluoride ($ZrF_4$), or a gas which contains Zr and an amino group such as tetrakis(ethylmethylamino)zirconium ($Zr[N(C_2H_5)(CH_3)]_4$, abbreviated as TEMAZ) may be used. As the oxygen-containing gas and the hydrogen-containing gas, the same gases as in the above embodiment may be used. Also, processing conditions may be the same, for example, as in the above embodiment.

As a metal-based thin film containing Hf, when a hafnium oxide film (HfO film) is formed, as a source gas, for example, a gas which contains Hf and a chloro group such as hafnium tetrachloride ($HfCl_4$), a gas which contains Hf and a fluoro group such as hafnium tetrafluoride ($HfF_4$), or a gas which contains Hf and an amino group such as tetrakis(ethylmethylamino)hafnium ($Hf[N(C_2H_5)(CH_3)]_4$, abbreviated as TEMAH) may be used. As the oxygen-containing gas and the hydrogen-containing gas, the same gases as in the above embodiment may be used. Also, processing conditions may be the same, for example, as in the above embodiment.

As a metal-based thin film containing Ta, when a tantalum oxide film (TaO film) is formed, as a source gas, for example, a gas which contains Ta and a chloro group such as tantalum pentachloride ($TaCl_5$), a gas which contains Ta and a fluoro group such as tantalum pentafluoride ($TaF_5$), or a gas which contains Ta and an ethoxy group such as pentaethoxytantalum ($Ta(OC_2H_5)_5$, abbreviated as PET) may be used. As the oxygen-containing gas and the hydrogen-containing gas, the same gases as in the above embodiment may be used. Also, processing conditions may be the same, for example, as in the above embodiment.

As a metal-based thin film containing Al, when an aluminum oxide film (AlO film) is formed, as a source gas, for example, a gas which contains Al and a chloro group such as aluminum trichloride ($AlCl_3$), a gas which contains Al and a fluoro group such as aluminum trifluoride ($AlF_3$), or a gas which contains Al and a methyl group such as trimethyl aluminum ($Al(CH_3)_3$, abbreviated as TMA) may be used. As the oxygen-containing gas and the hydrogen-containing gas, the same gases as in the above embodiment may be used. Also, processing conditions may be the same, for example, as in the above embodiment.

As a metal-based thin film containing Mo, when a molybdenum oxide film (MoO film) is formed, as a source gas, for example, a gas which contains Mo and a chloro group such as molybdenum pentachloride ($MoCl_5$) or a gas which contains Mo and a fluoro group such as molybdenum pentafluoride ($MoF_5$) may be used. As the oxygen-containing gas and the hydrogen-containing gas, the same gases as in the above embodiment may be used. Also, processing conditions may be the same, for example, as in the above embodiment.

In this way, the present invention may be applied to form the semiconductor-based thin film and the metal-based thin film. In this case, the same effects as in the above embodiment may be obtained. That is, the present invention may be generally applied to the substrate processing including a process of simultaneously supplying the oxygen-containing gas and the hydrogen-containing gas into the process chamber under heated atmosphere having a pressure lower than an atmospheric pressure.

Also, the process recipe (a program in which processing sequences or processing conditions are described) used in the above substrate processing may preferably be separately prepared (a plurality of recipes) according to content of substrate processing (film type, composition, film quality, film thickness, and the like). Then, when the substrate processing starts, an appropriate process recipe may be preferably selected out of the plurality of process recipes according to content of the substrate processing. Specifically, the plurality of process recipes separately prepared according to content of the substrate processing is preferably stored (installed) in advance in the memory device 121c provided in the substrate processing apparatus through telecommunication lines or the non-transitory computer-readable recording medium [the external memory device 123] recording the process recipe. Then, when the substrate processing starts, the CPU 121a provided in the substrate processing apparatus preferably appropriately selects an appropriate process recipe according to content of the substrate processing from among the plurality of process recipes stored in the memory device 121c. In such a configuration, it is possible to generally and repeatedly perform various types of substrate processing in the single substrate processing apparatus. In addition, it is possible to decrease an operation load (such as a load for inputting processing sequences or processing conditions) of an operator, thereby preventing operation errors and quickly starting the substrate processing.

In addition to creating a new process recipe, the process recipe may be prepared by, for example, changing an existing process recipe that is previously installed in the substrate processing apparatus. When the process recipe is changed, the changed process recipe may be installed in the substrate processing apparatus through the telecommunication lines or the non-transitory computer-readable recording medium recording the process recipe. Also, by manipulating the I/O device 122 provided in the existing substrate processing apparatus, the existing process recipe that is previously installed in the substrate processing apparatus may be directly changed.

Also, in the embodiment described above, while the example in which the plurality of substrates are batch-processed using the substrate processing apparatus including a hot wall-type processing furnace has been described, the present invention is not limited thereto. The present invention may be preferably applied when the plurality of substrates are batch-processed using a substrate processing apparatus including a cold wall-type processing furnace.

In addition, the above embodiments may be appropriately combined and used.

EXAMPLES

Example 1

As example 1, the SiO film was formed on the plurality of wafers by the film-forming sequence illustrated in FIG. SA using the substrate processing apparatus in the above embodiment. The HCDS gas was used as the source gas, the $O_2$ gas was used as the oxygen-containing gas, and the $H_2$ gas was used as the hydrogen-containing gas. Supply of the $O_2$ gas was performed using the nozzles 233d and 233e of the type illustrated in FIG. 4B. During film formation, the boat, that is, the wafer, was rotated. The processing conditions were set to predetermined values within the processing condition ranges described in the above embodiment. In addition, as comparative example 1, the SiO film was formed on the plurality of wafers using the vertical processing furnace illustrated in FIG. 6. Gas types, film-forming sequences, and processing conditions used in comparative example 1 were the same as in example 1.

Figure 10A:
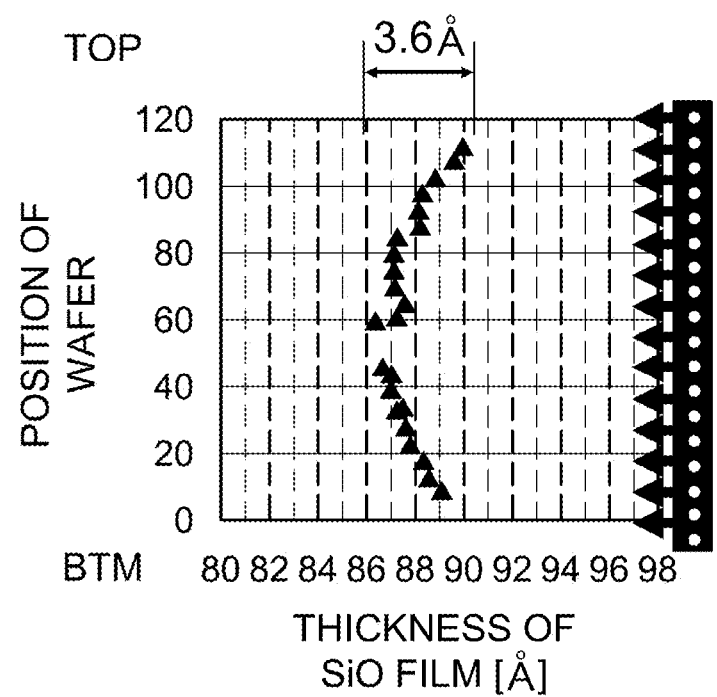
FIG. 10 is a diagram illustrating a measurement result of inter-plane film thickness uniformity of a SiO film, FIG. 1 OA is a diagram illustrating a comparative example.
FIG. 10B is a diagram illustrating an example.
Figure 10B:
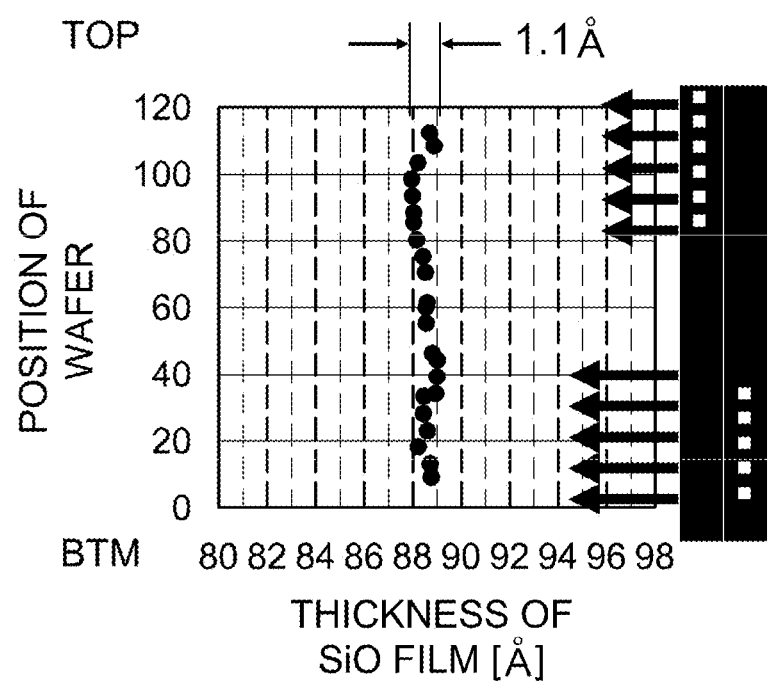

FIG. 10A is a graph showing inter-plane film thickness uniformity of the SiO film according to comparative example 1. FIG. 10B is a graph showing inter-plane film thickness uniformity of the SiO film according to example 1. In FIGS. 10A and 10B, a horizontal axis represents an in-plane average film thickness (A) of the SiO film formed on the wafer, and a vertical axis represents a position of the wafer in the process chamber (in the wafer arrangement region). As shown in FIG. 10, it may be understood that the in-plane average film thickness of the SiO film according to comparative example 1 decreases at the center of the wafer arrangement region and increases at the bottom and the top of the wafer arrangement region, and a difference thereof is a maximum of 3.6 Å. Also, it may be understood that the in-plane average film thickness of the SiO film according to example 1 is uniform at the bottom, the center, and the top of the wafer arrangement region, and a difference of the in-plane average film thicknesses is a maximum of 1.1 Å. That is, it may be understood that the in-plane average film thickness of the SiO film according to example 1 is more uniform than the in-plane average film thickness of the SiO film according to comparative example 1. Therefore, it may be understood that, when the $O_2$ gas is supplied into the process chamber using the nozzle including the gas supply hole that is provided at only the top and the bottom so as to correspond to only the wafers arranged at the top and the bottom out of the plurality of wafers, it is possible to improve the inter-plane film thickness uniformity of the SiO film.

Example 2

As example 2, the SiO film is formed on the plurality of wafers by the film-forming sequence illustrated in FIG. 5A using the substrate processing apparatus in the above embodiment. Gas types, film-forming sequences, and processing conditions used in example 2 were the same as in example 1. Supply of the $O_2$ gas was performed using the nozzles 233d and 233e of the type illustrated in FIG. 4B. Supply of the HCDS gas and supply of the $H_2$ gas were performed using the nozzle 233b. During film formation, the boat, that is, the wafer, was not rotated.

Also, as comparative example 2, the SiO film was formed on the plurality of wafers by the film-forming sequence illustrated in FIG. SA using the substrate processing apparatus in the above embodiment. Gas types, film-forming sequences, and processing conditions used in comparative example 2 were the same as in example 2. Supply of the $O_2$ gas was performed using the nozzle 233c, and supply of the HCDS gas and supply of the $H_2$ gas were performed using the nozzle 233b. The $O_2$ gas was not supplied from the nozzles 233d and 233e. During film formation, the boat, that is, the wafer, was not rotated.

FIG. 11A is a diagram illustrating the in-plane film thickness distribution of the SiO film according to comparative example 2. FIG. 11B is a diagram illustrating the film thickness distribution of the SiO film according to example 2. In a cross-sectional view of each processing furnace illustrated in FIG. 11, three ○ symbols at the top sequentially represent the nozzles 233b, 233a, and 233c from a right side, and two ○ symbols at the lower left sequentially represent the nozzles 233d and 233e from the top. In addition, in FIG. 11, "BTM," "CEN," and "TOP" represent positions of the wafer, that is, the bottom, the center, and the top of the wafer arrangement region. Also, in FIG. 11, "thin" represents that the film thickness of the SiO film is relatively thin and "thick" represents that the film thickness of the SiO film is relatively thick.

As illustrated in FIG. 11A, it may be understood that the film thickness of the SiO film according to comparative example 2 increases at all of the bottom, the center, and the top of the wafer arrangement region from a side from which the HCDS gas, the $H_2$ gas, and the $O_2$ gas is supplied to a side opposite thereof, that is, the film thickness increases toward the exhaust hole. In addition, it may be understood that the in-plane average film thickness of the SiO film is uniform at the bottom and the top of the wafer arrangement region. Also, it may be understood that the in-plane average film thickness of the SiO film becomes thinner at the center of the wafer arrangement region than the bottom and the top of the wafer arrangement region.

Also, as illustrated in FIG. 11B, it may be understood that the film thickness of the SiO film according to example 2 increases at the bottom and the top of the wafer arrangement region from a side from which the $O_2$ gas is supplied to a side opposite thereof, that is, the film thickness increases away from the side from which the $O_2$ gas is supplied. On the other hand, it may be understood that the film thickness increases at the center of the wafer arrangement region from a side from which the HCDS gas and the $H_2$ gas are supplied to a side opposite thereof, that is, the film thickness increases toward the exhaust hole. That is, it may be understood that the center of the wafer arrangement region shows different in-plane film thickness distribution of the SiO film from the bottom and the top of the wafer arrangement region. However, it may be understood that the in-plane average film thickness of the SiO film according to example 2 is uniform at the bottom, the center, and the top of the wafer arrangement region, and is more uniform than that of the SiO film of comparative example 2. Therefore, it may be understood that, when the $O_2$ gas is supplied into the process clamber using the nozzle including the gas supply hole that is provided at only the top and the bottom so as to correspond to only the wafers arranged at the top and the bottom out of the plurality of wafers, it is possible to improve the inter-plane film thickness uniformity of the SiO film.

Figure 12:
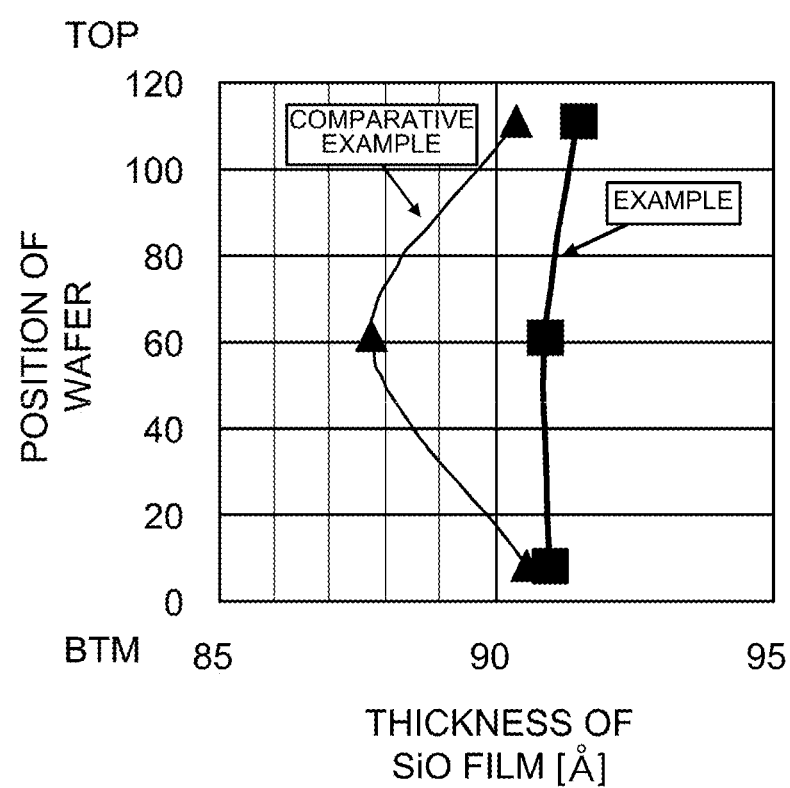
FIG. 12 is a diagram illustrating a relation between an in-plane average film thickness of a SiO film and a wafer position.

FIG. 12 is a graph showing inter-plane film thickness uniformity of the SiO films according to example 2 and comparative example 2. In FIG. 12, a horizontal axis represents an in-plane average film thickness (Å) of the SiO film formed on the wafer, and a vertical axis represents a position of the wafer in the process chamber (in the wafer arrangement region). In FIG. 12, ▲ denotes comparative example 2 and ■ denotes example 2. As shown in FIG. 12, the in-plane average film thickness of the SiO film according to comparative example 2 decreases at the center of the wafer arrangement region and increases at the bottom and the top of the wafer arrangement region. Accordingly, it may be understood that an influence of the inter-plane LE is large. In addition, the in-plane average film thickness of the SiO film according to example 2 is uniform at the bottom, the center, and the top of the wafer arrangement region and is more uniform than that of comparative example 2. Accordingly, it may be understood that occurrence of the in-plane LE may be suppressed. As a result, it may be understood that, when the $O_2$ gas is supplied into the process chamber using the nozzle including the gas supply hole that is provided at only the top and the bottom so as to correspond to only the wafers arranged at the top and the bottom out of the plurality of wafers, it is possible to improve the inter-plane film thickness uniformity of the SiO film.

According to the present invention, when a hydrogen-containing gas and an oxygen-containing gas are supplied into a process chamber accommodating a plurality of substrates to process a substrate, it is possible to improve inter-plane uniformity and in-plane uniformity of substrate processing without reducing productivity of the substrate processing.

Exemplary Embodiments of the Present Invention

Hereinafter, exemplary embodiments of the present invention are added.

Supplementary Note 1

According to an embodiment of the present invention, there is provided a substrate processing apparatus including:
a process chamber configured to accommodate and process a plurality of substrates arranged with intervals therebetween;
a first nozzle extending along a stacking direction of the plurality of substrates and configured to supply a hydrogen-containing gas into the process chamber; and
a second nozzle extending along the stacking direction of the plurality of substrates and configured to supply an oxygen-containing gas into the process chamber,
wherein the first nozzle includes a plurality of first gas supply holes disposed in a region extending from an upper portion to a lower portion of the first nozzle corresponding to a substrate arrangement region where the plurality of substrates are arranged wherein the plurality of first gas supply holes are configured to supply the hydrogen-containing gas toward the plurality of substrates, and
the second nozzle includes a plurality of second gas supply holes disposed at an upper portion and a lower portion of the second nozzle to correspond to upper substrates and lower substrates of the plurality of substrates wherein the plurality of second gas supply holes are configured to supply the oxygen-containing gas toward the plurality of substrates.

Supplementary Note 2

In the substrate processing apparatus of Supplementary note 1, it is preferable that the apparatus further includes:
a hydrogen-containing gas supply system connected to the first nozzle and configured to supply the hydrogen-containing gas into the process chamber through the first nozzle;
an oxygen-containing gas supply system connected to the second nozzle and configured to supply the oxygen-containing gas into the process chamber through the second nozzle;
a heater configured to heat an inside of the process chamber;
a pressure regulator configured to regulate an inside pressure of the process chamber; and
a control unit configured to control the hydrogen-containing gas supply system, the oxygen-containing gas supply system, the heater and the pressure regulator to process the plurality of substrates by supplying the oxygen-containing gas and the hydrogen-containing gas into the process chamber accommodating the plurality of substrates under heated atmosphere at a pressure lower than an atmospheric pressure.

Supplementary Note 3

In the substrate processing apparatus of Supplementary note 2, it is preferable that the control unit is configured to control the hydrogen-containing gas supply system, the oxygen-containing gas supply system, the heater and the pressure regulator to supply the oxygen-containing gas and the hydrogen-containing gas into the process chamber accommodating the plurality of substrates under the heated atmosphere at the pressure lower than the atmospheric pressure, and to process the plurality of substrates using an oxidizing species generated by reacting the oxygen-containing gas with the hydrogen-containing gas in the process chamber.

Supplementary Note 4

In the substrate processing apparatus of Supplementary note 1, it is preferable that the apparatus further includes:
a source gas supply system configured to supply a source gas into the process chamber;
a hydrogen-containing gas supply system connected to the first nozzle and configured to supply the hydrogen-containing gas into the process chamber through the first nozzle;
an oxygen-containing gas supply system connected to the second nozzle and configured to supply the oxygen-containing gas into the process chamber through the second nozzle:
a heater configured to heat an inside of the process chamber;
a pressure regulator configured to regulate an inside pressure of the process chamber; and
a control unit configured to control the source gas supply system, the hydrogen-containing gas supply system, the oxygen-containing gas supply system, the heater and the pressure regulator to perform a cycle a predetermined number of times to form oxide films on the plurality of substrates, the cycle including: (a) supplying the source gas into the process chamber accommodating the plurality of substrates; and (b) supplying the oxygen-containing gas and the hydrogen-containing gas into the process chamber under heated atmosphere at a pressure lower than an atmospheric pressure.

Supplementary Note 5

In the substrate processing apparatus of Supplementary note 4, it is preferable that the control unit is configured to control the source gas supply system, the hydrogen-containing gas supply system, the oxygen-containing gas supply system, the heater and the pressure regulator such that the process (a) includes forming an initial layer by supplying the source gas into the process chamber accommodating the plurality of substrates, and the process (b) includes changing the initial layer to an oxide layer using an oxidizing species generated by reacting the oxygen-containing gas and the hydrogen-containing gas supplied into the process chamber under the heated atmosphere at the pressure lower than the atmospheric pressure.

Supplementary Note 6

In the substrate processing apparatus of any of Supplementary notes 1 to 5, it is preferable that the second nozzle is spaced apart from the first nozzle at a predetermined distance along a circumferential direction of the plurality of substrates.

Supplementary Note 7

In the substrate processing apparatus of any of Supplementary notes 1 to 6, it is preferable that the apparatus further includes an exhaust hole configured to exhaust an inside of the process chamber, wherein the first nozzle is located at a position opposite to the exhaust hole with respect to a center of the plurality of substrates accommodated in the process chamber, and the second nozzle is located at a position other than the position opposite to the exhaust hole with respect to the center of the plurality of substrates accommodated in the process chamber.

Supplementary Note 8

In the substrate processing apparatus of any of Supplementary notes 1 to 7, it is preferable that the apparatus further includes an exhaust hole configured to exhaust an inside of the process chamber, wherein the second nozzle is closer to the exhaust hole than the first nozzle to the exhaust hole (a distance between the second nozzle and the exhaust hole is shorter than a distance between the first nozzle and the exhaust hole).

Supplementary Note 9

In the substrate processing apparatus of any of Supplementary notes 1 to 8, it is preferable that wherein the second nozzle includes:

an upper hole nozzle including at least one second gas supply hole disposed in a region corresponding to the upper substrates of the plurality of substrates; and a lower hole nozzle including at least one second gas supply hole disposed in a region corresponding to the lower substrates of the plurality of substrates.

Supplementary Note 10

In the substrate processing apparatus of any of Supplementary notes 2 to 9, it is preferable that the second nozzle includes:

an upper hole nozzle including at least one second gas supply hole disposed in a region corresponding to the upper substrates of the plurality of substrates; and a lower hole nozzle including at least one second gas supply hole disposed in a region corresponding to the lower substrates of the plurality of substrates, wherein an oxygen-containing gas supply system is connected to the upper hole nozzle and the lower hole nozzle, and is configured to independently control flow rates of the oxygen-containing gas supplied through the upper hole nozzle and the lower hole nozzle Supplementary Note 11

In the substrate processing apparatus of any of Supplementary notes 4 to 10, it is preferable that the source gas supply system is connected to the first nozzle.

Supplementary Note 12

In the substrate processing apparatus of any of Supplementary notes 4 to 10, it is preferable that the apparatus further includes a third nozzle including a plurality of third gas supply holes disposed in a region extending from an upper portion to a lower portion of the third nozzle corresponding to the substrate arrangement region wherein the plurality of third gas supply holes are configured to supply a gas toward the plurality of substrates, and wherein the source gas supply system is connected to the third nozzle.

Supplementary Note 13

In the substrate processing apparatus of any of Supplementary notes 1 to 12, it is preferable that the apparatus includes:

an inner tube forming the process chamber;

an outer tube surrounding the inner tube:

an exhaust hole provided at a sidewall of the inner tube; and an exhaust system configured to exhaust a space between the outer tube and the inner tube.

Supplementary Note 14

According to another embodiment of the present invention, there is provided a substrate processing apparatus, including:

an inner tube configured to accommodate and process a plurality of substrates arranged with intervals therebetween;

an outer tube surrounding the inner tube;

a first nozzle extending along a stacking direction of the plurality of substrates and configured to supply a hydrogen-containing gas into the inner tube;

a second nozzle extending along the stacking direction of the plurality of substrates and configured to supply an oxygen-containing gas into the inner tube, an exhaust hole disposed at a sidewall of the inner tube; and an exhaust system configured to exhaust a space between the outer tube and the inner tube, wherein the first nozzle includes a plurality of first gas supply holes disposed in a region extending from an upper portion to a lower portion of the first nozzle corresponding to a substrate arrangement region where the plurality of substrates are arranged, and the second nozzle includes a plurality of second gas supply holes disposed at an upper portion and a lower portion of the second nozzle to correspond to upper substrates and lower substrates of the plurality of substrates.

Supplementary Note 15

In the substrate processing apparatus of Supplementary note 13 or 14, it is preferable that the first nozzle is located at a position opposite to the exhaust hole with respect to a center of the plurality of substrates accommodated in the inner tube, and the second nozzle is located at a position other than the position opposite to the exhaust hole with respect to the center of the plurality of substrates accommodated in the inner tube.

Supplementary Note 16

In the substrate processing apparatus of any of Supplementary notes 13 to 15, it is preferable that the second nozzle is closer to the exhaust hole than the first nozzle to the exhaust hole.

Supplementary Note 17

According to still another embodiment of the present invention, there is provided a method of manufacturing a semiconductor device, including:

(a) accommodating a plurality of substrates arranged with intervals therebetween in a process chamber; and (b) supplying a hydrogen-containing gas and an oxygen-containing gas into the process chamber under heated atmosphere at a pressure lower than an atmospheric pressure to process the plurality of substrates, wherein the step (b) includes:

supplying the hydrogen-containing gas into the process chamber through a first nozzle including a plurality of first gas supply holes disposed in a region extending from an upper portion to a lower portion of the first nozzle corresponding to a substrate arrangement region where the plurality of substrates are arranged, wherein the plurality of first gas supply holes are configured to supply the hydrogen-containing gas toward the plurality of substrates; and supplying the oxygen-containing gas into the process chamber through a second nozzle including a plurality of second gas supply holes disposed at an upper portion and a lower portion of the second nozzle to correspond to upper substrates and lower substrates of the plurality of substrates wherein the plurality of second gas supply holes are configured to supply the oxygen-containing gas toward the plurality of substrates.

Supplementary Note 18

According to still another embodiment of the present invention, there is provided a method of manufacturing a semiconductor device, including:

(a) accommodating a plurality of substrates arranged with intervals therebetween in a process chamber; and (b) performing a cycle a predetermined number of times to form an oxide film on the plurality of substrates, the cycle including: (b-1) supplying the source gas into the process chamber, and (b-2) supplying the hydrogen-containing gas and the oxygen-containing gas into the process chamber under heated atmosphere at a pressure lower than an atmospheric pressure wherein the step (b-2) includes:

supplying the hydrogen-containing gas into the process chamber through a first nozzle including a plurality of first gas supply holes disposed in a region extending from an upper portion to a lower portion of the first nozzle corresponding to a substrate arrangement region where the plurality of substrates are arranged; and supplying the oxygen-containing gas into the process chamber through a second nozzle including a plurality of second gas supply holes disposed at an upper portion and a lower portion of the second nozzle to correspond to upper substrates and lower substrates of the plurality of substrates.

Supplementary Note 19

According to still another embodiment of the present invention, there are provided a program and a non-transitory computer-readable recording medium storing the program that causes a computer to perform:

(a) accommodating a plurality of substrates arranged with intervals therebetween in a process chamber; and (b) supplying a hydrogen-containing gas and an oxygen-containing gas into the process chamber under heated atmosphere at a pressure lower than an atmospheric pressure to process the plurality of substrates, wherein the sequence (b) includes:

supplying the hydrogen-containing gas into the process chamber through a first nozzle including a plurality of first gas supply holes disposed in a region extending from an upper portion to a lower portion of the first nozzle corresponding to a substrate arrangement region where the plurality of substrates are arranged; and supplying the oxygen-containing gas into the process chamber through a second nozzle including a plurality of second gas supply holes disposed at an upper portion and a lower portion of the second nozzle to correspond to upper substrates and lower substrates of the plurality of substrates.

Supplementary Note 20

According to still another embodiment of the present invention, there are provided a program and a non-transitory computer-readable recording medium storing the program that causes a computer to perform:

(a) accommodating a plurality of substrates arranged with intervals therebetween in a process chamber; and (b) performing a cycle a predetermined number of times to form an oxide film on the plurality of substrates, the cycle including: (b-1) supplying the source gas into the process chamber; and (b-2) supplying the hydrogen-containing gas and the oxygen-containing gas into the process chamber under heated atmosphere at a pressure lower than an atmospheric pressure wherein the step (b-2) includes:

supplying the hydrogen-containing gas into the process chamber through a first nozzle including a plurality of first gas supply holes disposed in a region extending from an upper portion to a lower portion of the first nozzle corresponding to a substrate arrangement region where the plurality of substrates are arranged; and supplying the oxygen-containing gas into the process chamber through a second nozzle including a plurality of second gas supply holes disposed at an upper portion and a lower portion of the second nozzle to correspond to upper substrates and lower substrates of the plurality of substrates.

What is claimed is:

1. A substrate processing apparatus comprising:
a boat accommodating a plurality of substrates arranged with intervals therebetween;
a process chamber where the plurality of substrates accommodated in the boat is processed, the process chamber including a cylindrical shape;
a first nozzle configured to supply a hydrogen-containing gas into the process chamber, the first nozzle extending at least from a lower end of the boat to an upper end of the boat along a stacking direction of the plurality of substrates, the first nozzle comprising an upper portion and a lower portion, wherein the upper portion and the lower portion are provided with a plurality of first gas supply holes facing an entirety of a region between the lower end and the upper end of the boat loaded with the plurality of substrates;

a second nozzle configured to supply an oxygen-containing gas into the process chamber, the second nozzle extending at least from the lower end of the boat to the upper end of the boat along the stacking direction of the plurality of substrates, the second nozzle comprising an upper portion and a lower portion wherein only the upper portion is provided with a plurality of second gas supply holes facing an upper portion of the region between the lower end of the boat and the upper end of the boat loaded with the plurality of substrates and wherein a side surface of the lower portion of the second nozzle is closed without a hole;

a third nozzle configured to supply the oxygen-containing gas into the process chamber, the third nozzle extending at least from the lower end of the boat to the upper end of the boat along the stacking direction of the plurality of substrates, the third nozzle comprising an upper portion extending vertically at least to a maximum height of the upper end of the boat and a lower portion, wherein only the lower portion is provided with a plurality of third gas supply holes facing a lower portion of the region between the lower end of the boat and the upper end of the boat loaded with the plurality of substrates and wherein a side surface of the upper portion of the third nozzle is closed without a hole;

a first nozzle accommodating chamber accommodating the first nozzle including a first side wall and a second side wall that protrude in a radially outward direction from the inner tube; and a second nozzle accommodating chamber accommodating the second nozzle and the third nozzle, the second nozzle accommodating chamber being different from the first nozzle accommodating chamber and including a third side wall and a fourth side wall that protrude in the radially outward direction from the inner tube, wherein the second nozzle and the third nozzle extend to a same height, wherein the second side wall is disposed at a position separated from the third side wall by a predetermined distance and the first side wall and fourth side wall are separated by a second predetermined distance, and wherein the first nozzle accommodating chamber and the second nozzle accommodating chamber are disposed at positions at which a central angle formed by a straight line connecting a center of the process chamber and a center of the first nozzle accommodating chamber and a straight line connecting the center of the process chamber and a center of the second nozzle accommodating chamber becomes 30° to 150°.

2. The substrate processing apparatus of claim 1, further comprising:

a hydrogen-containing gas supply system connected to the first nozzle and configured to supply the hydrogen-containing gas into the process chamber through the first nozzle;

an oxygen-containing gas supply system connected to the second nozzle and the third nozzle and configured to supply the oxygen-containing gas into the process chamber through the second nozzle and the third nozzle;

a heater configured to heat an inside of the process chamber;

a pressure regulator configured to regulate an inside pressure of the process chamber; and a control unit configured to control the hydrogen-containing gas supply system, the oxygen-containing gas supply system, the heater and the pressure regulator to process the plurality of substrates by supplying the oxygen-containing gas through the second nozzle and the third nozzle while supplying the hydrogen-containing gas through the first nozzle into the process chamber accommodating the plurality of substrates under heated atmosphere at a pressure lower than an atmospheric pressure.

3. The substrate processing apparatus of claim 2, wherein the control unit is configured to control the hydrogen-containing gas supply system, the oxygen-containing gas supply system, the heater and the pressure regulator to supply the oxygen-containing gas through the second nozzle and the third nozzle while supplying the hydrogen-containing gas through the first nozzle into the process chamber accommodating the plurality of substrates under the heated atmosphere at the pressure lower than the atmospheric pressure, and to process the plurality of substrates using an oxidizing species generated by reacting the oxygen-containing gas with the hydrogen-containing gas in the process chamber.

4. The substrate processing apparatus of claim 1, further comprising:

a source gas supply system configured to supply a source gas into the process chamber;

a hydrogen-containing gas supply system connected to the first nozzle and configured to supply the hydrogen-containing gas into the process chamber through the first nozzle;

an oxygen-containing gas supply system connected to the second nozzle and the third nozzle and configured to supply the oxygen-containing gas into the process chamber through the second nozzle and the third nozzle;

a heater configured to heat an inside of the process chamber;

a pressure regulator configured to regulate an inside pressure of the process chamber; and a control unit configured to control the source gas supply system, the hydrogen-containing gas supply system, the oxygen-containing gas supply system, the heater and the pressure regulator to perform a cycle a predetermined number of times to form oxide films on the plurality of substrates, the cycle comprising: (a) supplying the source gas into the process chamber accommodating the plurality of substrates; and (b) supplying the oxygen-containing gas through the second nozzle and the third nozzle while supplying the hydrogen-containing gas through the first nozzle into the process chamber under heated atmosphere at a pressure lower than an atmospheric pressure.

5. The substrate processing apparatus of claim 4, wherein the control unit is configured to control the source gas supply system, the hydrogen-containing gas supply system, the oxygen-containing gas supply system, the heater and the pressure regulator such that the process (a) comprises forming an initial layer by supplying the source gas into the process chamber accommodating the plurality of substrates, and the process (b) comprises changing the initial layer to an oxide layer using an oxidizing species generated by reacting the oxygen-containing gas supplied into the process chamber through the second nozzle and the third nozzle with the hydrogen-containing gas supplied through the first nozzle under the heated atmosphere at the pressure lower than the atmospheric pressure.

6. The substrate processing apparatus of claim 4, wherein the source gas supply system is connected to the first nozzle.

7. The substrate processing apparatus of claim 4, further comprising a fourth nozzle comprising a plurality of fourth gas supply holes disposed in a region extending from an upper portion to a lower portion thereof corresponding to the substrate arrangement region wherein the plurality of fourth gas supply holes are configured to supply a gas toward the plurality of substrates, and wherein the fourth nozzle is connected to the source gas supply system.

8. The substrate processing apparatus of claim 1, wherein the second nozzle and the third nozzle are spaced apart from the first nozzle at a predetermined distance along a circumferential direction of the plurality of substrates.

9. The substrate processing apparatus of claim 1, further comprising an exhaust hole configured to exhaust an inside of the process chamber, wherein the first nozzle is located at a position opposite to the exhaust hole with respect to a center of the process chamber, and the second nozzle and the third nozzle are located at a position other than the position opposite to the exhaust hole with respect to the center of the process chamber.

10. The substrate processing apparatus of claim 1, further comprising an exhaust hole configured to exhaust an inside of the process chamber, wherein the second nozzle and the third nozzle are closer to the exhaust hole than the first nozzle to the exhaust hole.

11. The substrate processing apparatus of claim 1, wherein an oxygen-containing gas supply system is connected to each of the second nozzle and the third nozzle, and is configured to independently control flow rates of the oxygen-containing gas supplied through the second nozzle and the third nozzle.

12. The substrate processing apparatus of claim 1, further comprising:

an inner tube forming the process chamber;
an outer tube surrounding the inner tube;
an exhaust hole provided at a sidewall of the inner tube; and
an exhaust system configured to exhaust a space between the outer tube and the inner tube.

13. The substrate processing apparatus of claim 12, wherein the first nozzle is located at a position opposite to the exhaust hole with respect to a center of the inner tube, and the second nozzle and the third nozzle are located at a position other than the position opposite to the exhaust hole with respect to the center of the inner tube.

14. The substrate processing apparatus of claim 12, wherein the second nozzle and the third nozzle are closer to the exhaust hole than the first nozzle to the exhaust hole.

15. The substrate processing apparatus of claim 12, wherein the first nozzle accommodating chamber and the second nozzle accommodating chamber are provided to protrude in a radially outward direction with respect to the inner tube from the sidewall of the inner tube.

16. The substrate processing apparatus of claim 1, wherein the plurality of second gas supply holes are disposed at the upper portion of the side surface of the second nozzle corresponding to substrates of the plurality of substrates disposed in a region of top one fourth portion to top one third portion of the substrate arrangement region, and the third gas supply holes are disposed at the lower portion of the side surface of the third nozzle corresponding to substrates of the plurality of substrates disposed in a region of bottom one fourth portion to bottom one third portion of the substrate arrangement region.

17. The substrate processing apparatus of claim 1, wherein each of the first nozzle, the second nozzle and the third nozzle comprises a gas vent hole at a top surface thereof.

18. The substrate processing apparatus of claim 1, wherein the first nozzle accommodating chamber and the second nozzle accommodating chamber are provided in a channel shape extending in the stacking direction of the plurality of substrates.

19. The substrate processing apparatus of claim 1, wherein the inner walls of the first nozzle accommodating chamber and the second nozzle accommodating chamber configure an inner wall of the process chamber.

20. A substrate processing apparatus comprising:

a boat accommodating a plurality of substrates arranged with intervals therebetween;
a process chamber where the plurality of substrates accommodated in the boat is processed, the process chamber including a cylindrical shape;
a first nozzle extending at least from a lower end of the boat to an upper end of the boat along a stacking direction of the plurality of substrates, the first nozzle comprising an upper portion and a lower portion wherein the upper portion and the lower portion are provided with a plurality of first gas supply holes facing an entirety of a region between the lower end of the boat and the upper end of the boat loaded with the plurality of substrates;
a second nozzle extending at least from the lower end to the upper end of the boat along the stacking direction of the plurality of substrates, the second nozzle comprising an upper portion and a lower portion wherein only the upper portion is provided with a plurality of second gas supply holes facing an upper portion of the region between the lower end of the boat and the upper end of the boat loaded with the plurality of substrates and wherein a side surface of the lower portion of the second nozzle is closed without a hole;
a third nozzle extending at least from the lower end to the upper end of the boat along the stacking direction of the plurality of substrates, the third nozzle comprising an upper portion extending vertically at least to a maximum height of the upper end of the boat and a lower portion, wherein only the lower portion is provided with a plurality of third gas supply holes facing a lower portion of the region between the lower end of the boat and the upper end of the boat loaded with the plurality of substrates and wherein a side surface of the upper portion of the third nozzle is closed without a hole;

a first nozzle accommodating chamber accommodating the first nozzle including a first side wall and a second side wall that protrude in a radially outward direction from the inner tube;

a second nozzle accommodating chamber accommodating the second nozzle and the third nozzle, the second nozzle accommodating chamber being different from the first nozzle accommodating chamber and including a third side wall and a fourth side wall that protrude in a radially outward direction from the inner tube;

a hydrogen-containing gas supply system connected to the first nozzle and configured to supply a hydrogen-containing gas into the process chamber through the first nozzle;

an oxygen-containing gas supply system connected to the second nozzle and the third nozzle and configured to supply an oxygen-containing gas into the process chamber through the second nozzle and the third nozzle;

a source gas supply system connected to the first nozzle and configured to supply a source gas into the process chamber through the first nozzle;

a heater configured to heat an inside of the process chamber;

a pressure regulator configured to regulate an inside pressure of the process chamber; and a control unit configured to control the hydrogen-containing gas supply system, the oxygen-containing gas supply system, the source gas supply system, the heater and the pressure regulator to perform a cycle a predetermined number of times to form oxide films on the plurality of substrates, the cycle comprising: (a) supplying the source gas through the first nozzle into the process chamber accommodating the plurality of substrates; and (b) supplying the oxygen-containing gas through the second nozzle and the third nozzle while supplying the hydrogen-containing gas through the first nozzle into the process chamber under heated atmosphere at a pressure lower than an atmospheric pressure, wherein the second nozzle and the third nozzle extend to a same height, wherein the second side wall is disposed at a position separated from the third side wall first by a predetermined distance and the first side wall and fourth side wall are separated by a second predetermined distance, and wherein the first nozzle accommodating chamber and the second nozzle accommodating chamber are disposed at positions at which a central angle formed by a straight line connecting a center of the process chamber and a center of the first nozzle accommodating chamber and a straight line connecting the center of the process chamber and a center of the second nozzle accommodating chamber becomes 30° to 150°.

21. A substrate processing apparatus comprising:

a boat accommodating a plurality of substrates arranged with intervals therebetween;

a process chamber where the plurality of substrates accommodated in the boat is processed, the process chamber including a cylindrical shape;

a first nozzle extending at least from a lower end of the boat to an upper end of the boat along a stacking direction of the plurality of substrates, the first nozzle comprising an upper portion and a lower portion wherein the upper portion and the lower portion are provided with a plurality of first gas supply holes facing an entirety of a region between the lower end of the boat and the upper end of the boat loaded with the plurality of substrates;

a second nozzle extending at least from the lower end of the boat to the upper end of the boat along the stacking direction of the plurality of substrates, the second nozzle comprising an upper portion and a lower portion wherein only the upper portion is provided with a plurality of second gas supply holes facing an upper portion of the region between the lower end of the boat and the upper end of the boat loaded with the plurality of substrates and wherein a side surface of the lower portion of the second nozzle is closed without a hole;

a third nozzle extending at least from the lower end of the boat to the upper end of the boat along the stacking direction of the plurality of substrates, the third nozzle comprising an upper portion extending vertically at least to a maximum height of the upper end of the boat and a lower portion, wherein only the lower portion is provided with a plurality of third gas supply holes facing a lower portion of the region between the lower end of the boat and the upper end of the boat loaded with the plurality of substrates and wherein a side surface of the upper portion of the third nozzle is closed without a hole;

a first nozzle accommodating chamber accommodating the first nozzle including a first side wall and a second side wall that protrude in a radially outward direction from the inner tube;

a second nozzle accommodating chamber accommodating the second nozzle and the third nozzle, the second nozzle accommodating chamber being different from the first nozzle accommodating chamber and including a third side wall and a fourth side wall that protrude in a radially outward direction from the inner tube;

a fourth nozzle extending along the stacking direction of the plurality of substrates;

a hydrogen-containing gas supply system connected to the first nozzle and configured to supply a hydrogen-containing gas into the process chamber through the first nozzle;

an oxygen-containing gas supply system connected to the second nozzle and the third nozzle and configured to supply an oxygen-containing gas into the process chamber through the second nozzle and the third nozzle;

a source gas supply system connected to the fourth nozzle and configured to supply a source gas into the process chamber through the fourth nozzle;

a heater configured to heat an inside of the process chamber;

a pressure regulator configured to regulate an inside pressure of the process chamber; and a control unit configured to control the hydrogen-containing gas supply system, the oxygen-containing gas supply system, the source gas supply system, the heater and the pressure regulator to perform a cycle a predetermined number of times to form oxide films on the plurality of substrates, the cycle comprising: (a) supplying the source gas through the fourth nozzle into the process chamber accommodating the plurality of substrates; and (b) supplying the oxygen-containing gas through the second nozzle and the third nozzle while supplying the hydrogen-containing gas through the first nozzle into the process chamber under heated atmosphere at a pressure lower than an atmospheric pressure, wherein the second nozzle and the third nozzle extend to a same height, wherein the second side wall is disposed at a position separated from the third side wall by a predetermined distance and the first side wall and fourth side wall are separated by a second predetermined distance, wherein the fourth nozzle comprises a plurality of fourth gas supply holes disposed in a region extending from an upper portion to a lower portion of a side surface thereof corresponding to the substrate arrangement region, wherein the plurality of fourth gas supply holes are configured to supply the source gas toward the plurality of substrates, and wherein the first nozzle accommodating chamber and the second nozzle accommodating chamber are disposed at positions at which a central angle formed by a straight line connecting a center of the process chamber and a center of the first nozzle accommodating chamber and a straight line connecting the center of the process chamber and a center of the second nozzle accommodating chamber becomes 30° to 150°.

* * * * *